(12) United States Patent
Jin et al.

(10) Patent No.: US 11,984,420 B2
(45) Date of Patent: May 14, 2024

(54) SEMICONDUCTOR DEVICE

(71) Applicant: SAMSUNG ELECTRONICS CO., LTD., Suwon-si (KR)

(72) Inventors: Jeonggi Jin, Suwon-si (KR); Solji Song, Suwon-si (KR); Taehwa Jeong, Suwon-si (KR); Jinho Chun, Suwon-si (KR); Juil Choi, Suwon-si (KR); Atsushi Fujisaki, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 18/074,134

(22) Filed: Dec. 2, 2022

(65) Prior Publication Data

US 2023/0102285 A1    Mar. 30, 2023

Related U.S. Application Data

(63) Continuation of application No. 17/088,350, filed on Nov. 3, 2020, now Pat. No. 11,538,783.

(30) Foreign Application Priority Data

Mar. 27, 2020    (KR) .................. 10-2020-0037361

(51) Int. Cl.
*H01L 23/00*    (2006.01)
*H01L 23/522*    (2006.01)

(52) U.S. Cl.
CPC .......... *H01L 24/14* (2013.01); *H01L 23/5226* (2013.01); *H01L 2224/13008* (2013.01); *H01L 2224/13009* (2013.01); *H01L 2224/13166* (2013.01); *H01L 2224/13171* (2013.01); *H01L 2224/13184* (2013.01); *H01L 2224/16146* (2013.01)

(58) Field of Classification Search
CPC ................. H01L 23/5226; H01L 24/14; H01L 2224/13008–16146
See application file for complete search history.

(56) References Cited

U.S. PATENT DOCUMENTS

| | | | |
|---|---|---|---|
| 7,915,088 B2 | 3/2011 | Kobayashi et al. | |
| 7,928,534 B2 | 4/2011 | Hsu et al. | |
| 9,048,125 B2 | 6/2015 | Paek et al. | |
| 9,368,454 B2 | 6/2016 | Tsai et al. | |
| 9,716,066 B2 | 7/2017 | Lee et al. | |
| 10,217,716 B2 | 2/2019 | Yu et al. | |
| 2014/0061888 A1 | 3/2014 | Lin et al. | |
| 2015/0221601 A1 | 8/2015 | Kim et al. | |
| 2016/0353576 A1* | 12/2016 | Kusama | H01L 23/3142 |

(Continued)

*Primary Examiner* — Hoa B Trinh
(74) *Attorney, Agent, or Firm* — Fish & Richardson P.C.

(57) ABSTRACT

A semiconductor package including a semiconductor chip, a redistribution layer structure disposed under the semiconductor chip, a bump pad disposed under the redistribution layer structure and having an upper structure of a first width and a lower structure of a second width less than the first width, a metal seed layer disposed along a lower surface of the upper structure and a side surface of the lower structure, an insulating layer surrounding the redistribution layer structure and the bump pad, and a bump structure disposed under the bump pad. A first undercut is disposed at one end of the metal seed layer that contacts the upper structure, and a second undercut is disposed at an other end of the metal seed layer that contacts the lower structure.

20 Claims, 30 Drawing Sheets

(56) References Cited

U.S. PATENT DOCUMENTS

| | | |
|---|---|---|
| 2017/0010249 A1* | 1/2017 | Kim .................. G01N 33/84 |
| 2019/0013273 A1 | 1/2019 | Jeng et al. |
| 2019/0139784 A1 | 5/2019 | Lin et al. |
| 2020/0043842 A1 | 2/2020 | Kim et al. |
| 2020/0083201 A1 | 3/2020 | Suk et al. |

* cited by examiner

SEMICONDUCTOR DEVICE

CROSS-REFERENCE TO RELATED APPLICATION

This is a Continuation of U.S. application Ser. No. 17/088,350, filed Nov. 3, 2020, and a claim priority under 35 U.S.C. § 119 is made to Korean Patent Application No. 10-2020-0037361, filed on Mar. 27, 2020, in the Korean Intellectual Property Office, the entirety of which is hereby incorporated by reference.

BACKGROUND

The present disclosure relates to semiconductor packages, and more particularly to semiconductor packages including a redistribution layer.

With the rapid development of the electronics industry and so as to meet the needs of users, electronic devices are becoming more compact and multifunctional. Accordingly, there is an increasing need for miniaturization and multi-functionality of semiconductor chips used in electronic devices. Semiconductor chips having fine pitch connection terminals are therefore required, and micro-sized electrode pads are required to mount high-capacity semiconductor chips in structures having limited semiconductor package size. Consequently, a redistribution layer for electrically connecting an external connection terminal to a micro-sized electrode pad included in a semiconductor package is required.

SUMMARY

Embodiments of the inventive concepts provide a semiconductor package with improved reliability and manufacturing productivity by reducing defects caused by bump pads, and a method of manufacturing the same.

Embodiments of the inventive concepts provide a semiconductor package including a semiconductor chip; a redistribution layer structure disposed under the semiconductor chip; a bump pad disposed under the redistribution layer structure, the bump pad having an upper structure of a first width and a lower structure of a second width less than the first width; a metal seed layer disposed along a lower surface of the upper structure and a side surface of the lower structure; an insulating layer surrounding the redistribution layer structure and the bump pad; and a bump structure disposed under the bump pad. A first undercut is disposed one end of the metal seed layer that contacts the upper structure, and a second undercut is disposed at an other end of the metal seed layer that contacts the lower structure.

Embodiments of the inventive concepts further provide a semiconductor package including a first sub-package including a first semiconductor chip; a second sub-package disposed on the first sub-package and including a second semiconductor chip; and an inter-package connection structure connecting the first sub-package to the second sub-package. Each of the first sub-package and the second sub-package includes a lower redistribution layer structure; a bump pad disposed under the lower redistribution layer structure, the bump pad having an upper structure of a first width and a lower structure of a second width less than the first width; a metal seed layer disposed along the lower surface of the upper structure and the side surface of the lower structure; a lower insulating layer surrounding the lower redistribution layer structure and the bump pad; and a bump structure disposed under the bump pad. A first undercut is disposed at one end of the metal seed layer that contacts the upper structure, and a second undercut is disposed at an other end of the metal seed layer that contacts the lower structure.

Embodiments of the inventive concepts still further provide a semiconductor package including a bump structure; a T-shaped bump pad disposed on the bump structure, the T-shaped bump structure having an upper structure and a lower structure with a step difference between the upper structure and the lower structure; a redistribution layer structure disposed on the bump pad and having a plurality of redistribution layer lines; a plurality of insulating layers surrounding the redistribution layer structure and the bump pad; a metal seed layer conformally disposed between the lower surface of the upper structure and a lowermost insulating layer of the plurality of insulating layers, and between the side surface of the lower structure and the lowermost insulating layer; and a semiconductor chip disposed on the redistribution layer structure and electrically connected to the bump structure. A first undercut is disposed at one end of the metal seed layer, a second undercut is disposed at an other end of the metal seed layer, and the first undercut and the second undercut extend orthogonal to each other.

Embodiments of the inventive concepts also provide a semiconductor package including a redistribution layer structure having a first main surface and second main surface opposite the first main surface, the redistribution layer structure including a redistribution layer line and an insulating layer; a semiconductor chip on the first main surface of the redistribution layer structure and connected to the redistribution layer line; a bump pad at the second main surface of the redistribution layer structure, the bump pad including a first structure buried in the redistribution layer structure and connected to the redistribution layer line, and a second structure protruding from the first structure, the second structure having a pad surface exposed from the insulating layer at the second main surface of the redistribution layer structure; and a metal seed layer disposed between the insulating layer and a bottom surface of the first structure, and between the insulating layer and a side surface of the second structure, the metal seed layer having first and second undercuts at opposite ends thereof.

BRIEF DESCRIPTION OF THE DRAWINGS

Embodiments of the inventive concepts will be more clearly understood from the following detailed description taken in conjunction with the accompanying drawings in which.

DETAILED DESCRIPTION OF THE EMBODIMENTS

Hereinafter, embodiments of the inventive concepts will be described in detail with reference to the accompanying drawings.

Figure 1:
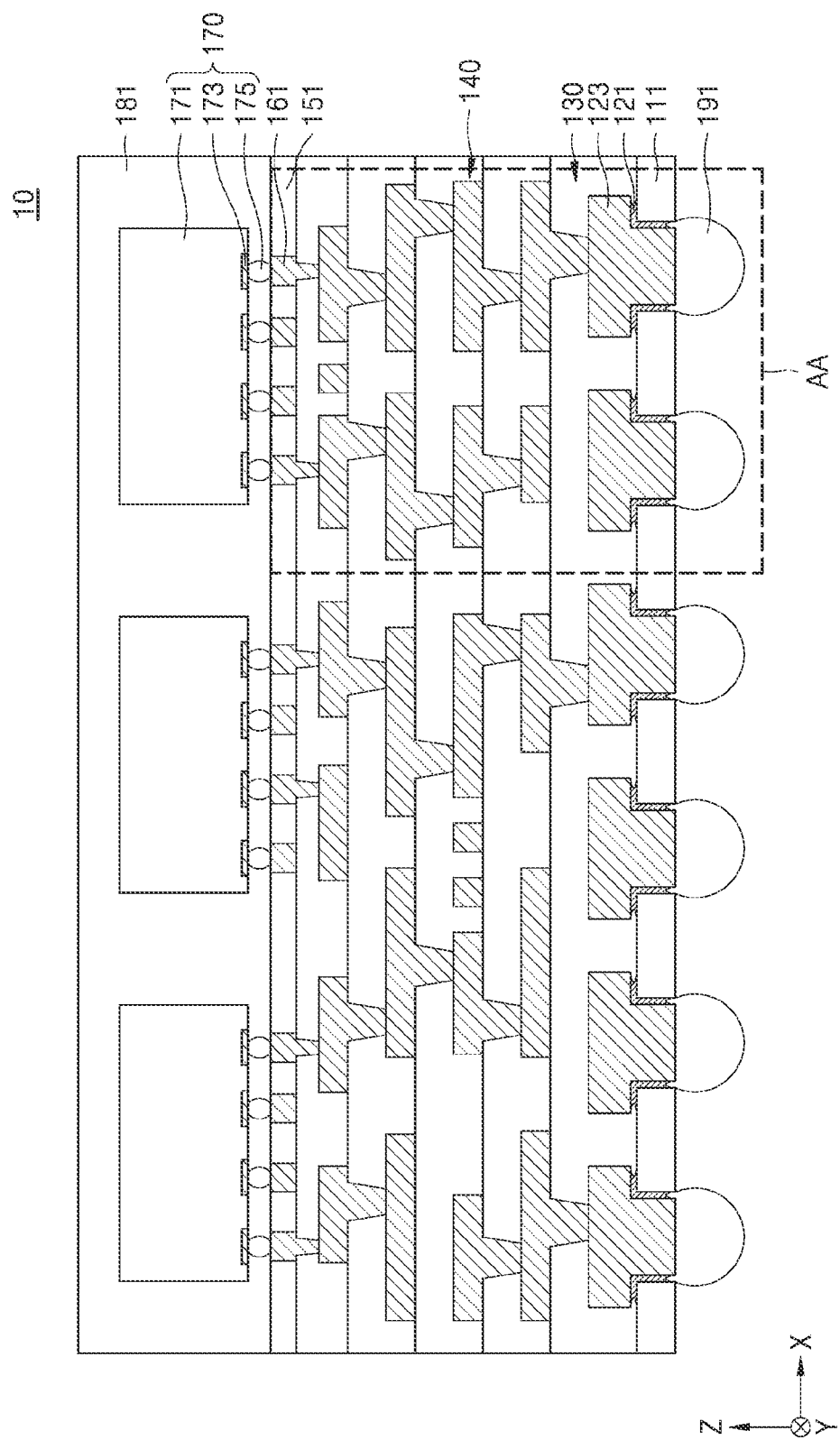
FIG. 1 illustrates a cross-sectional view of a semiconductor package according to embodiments of the inventive concepts.
Figure 2:
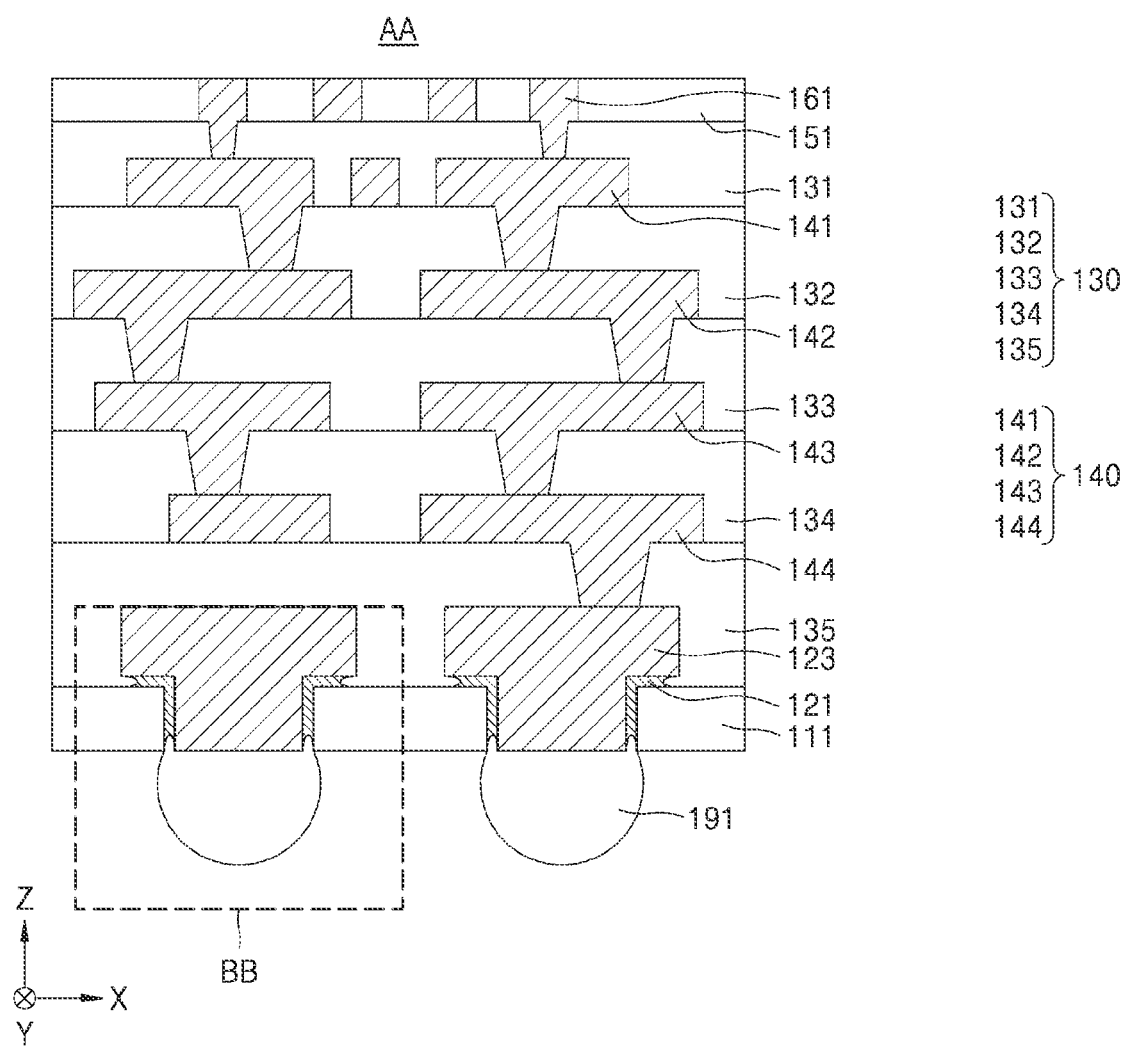
FIG. 2 illustrates an enlarged cross-sectional view of region AA of FIG. 1.
Figure 3:
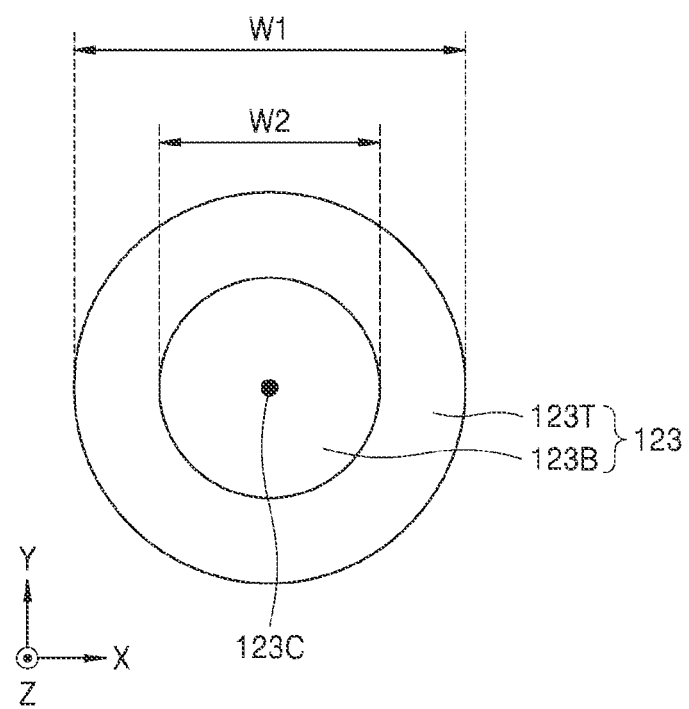
FIG. 3 illustrates a bottom view showing a bump pad of FIG. 2.
Figure 4:
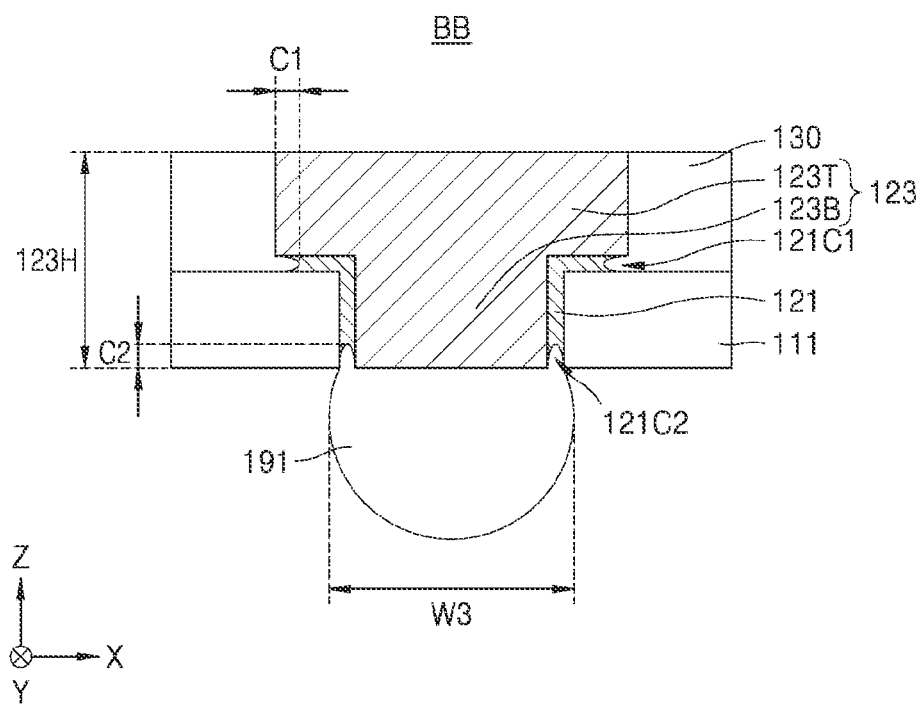
FIG. 4 illustrates an enlarged cross-sectional view of region BB of FIG. 2.

FIG. 1 illustrates a cross-sectional view of a semiconductor package according to embodiments of the inventive concepts. FIG. 2 illustrates an enlarged cross-sectional view of a region AA of FIG. 1. FIG. 3 illustrates a bottom view showing a bump pad of FIG. 2. FIG. 4 illustrates an enlarged cross-sectional view of a region BB of FIG. 2.

Referring to FIGS. 1 to 4 together, semiconductor package 10 includes semiconductor chip(s) 170, redistribution layer structure(s) 140 disposed under the semiconductor chip(s) 170, bump pad(s) 123 disposed under the redistribution layer structure(s) 140, metal seed layer(s) 121 disposed along a portion of the side surfaces of the bump pad(s) 123, an insulating layer 130 surrounding the redistribution layer structure(s) 140 and the bump pad(s) 123, and bump structure(s) 191 disposed under the bump pad(s) 123.

If the size of the semiconductor chip 170 is reduced or the number of input/output terminals of semiconductor chip 170 increases, the semiconductor package 10 may be unable to accommodate all of the external connection terminals (e.g., input/output terminals) within a main surface of the semiconductor chip 170. Accordingly, the semiconductor package 10 may be made to have a fan-out wafer level package (FO-WLP) or fan-out panel level package (FO-PLP) structure including an external connection terminal by extending the redistribution layer structure 140 to the molding member 181 forming an applied to the semiconductor package 10.

In addition, in the FO-WLP, the semiconductor package 10 according to embodiments of the inventive concepts may be implemented through a chip-last manufacturing method in which the redistribution layer structure 140 is first formed on a support substrate 101 (see FIG. 13), and the semiconductor chip 170 is later mounted on the already formed redistribution layer structure 140. However, for convenience of understanding, the semiconductor chip 170 will be first described as follows, regardless of the formation order of the semiconductor chip 170 with respect to the redistribution layer structure 140.

The semiconductor chip 170 may include for example a logic chip or a memory chip. The logic chip may include for example a microprocessor, an analog element, or a digital signal processor. Further, the memory chip may include for example a volatile memory chip such as dynamic random access memory (DRAM) or static RAM (SRAM), or a non-volatile memory chip such as phase-change RAM (PRAM), magnetoresistive RAM (MRAM), resistive RAM (RRAM), or ferroelectric RAM (FeRAM). In some embodiments, the semiconductor chip 170 may include a high bandwidth memory chip. The semiconductor package 10 may include a plurality of semiconductor chips 170.

The semiconductor chip 170 may be understood as including a semiconductor device having an integrated circuit. For example, the semiconductor chip 170 may include a semiconductor substrate 171 having active and inactive surfaces facing each other. A circuit part for implementing an integrated circuit function of the semiconductor chip 170 may be formed on the active surface of the semiconductor substrate 171 through a semiconductor manufacturing process. That is, a wiring layer such as a conductive wiring, an interlayer insulating film disposed therebetween, and an individual unit element may be formed on the semiconductor substrate 171.

Further, the semiconductor chip 170 may include an electrode pad 173 formed in the semiconductor substrate 171 to extend the function of the circuit part to the outside. A peripheral portion (e.g., side surface) of the electrode pad 173 may be covered by a protective layer formed on the active surface of the semiconductor substrate 171, and the central portion of the electrode pad 173 may be exposed from the protective layer. The protective layer may physically and chemically protect the semiconductor device on the active surface of the semiconductor substrate 171. The protective layer may include for example an inorganic insulating material such as silicon oxide, silicon nitride, and silicon oxynitride, or an organic insulating material such as an insulating polymer, or an insulating material composed of a combination thereof.

The electrode pad 173 may have the shape of for example a polygon such as a square, a hexagon, or an octagon, or may be circular or oval. The electrode pad 173 may be formed to have a predetermined size or more to withstand electrical and mechanical stress. Hereinafter, a surface on which the electrode pad 173 is formed will be referred to as a lower surface of the semiconductor chip 170. A solder bump 175 may be disposed under the electrode pad 173.

The molding member 181 may protect the semiconductor chip 170 from external influences such as contamination and impact. In order to perform this role, the molding member 181 may be made of an epoxy mold compound, a resin, or the like. In addition, the molding member 181 may be formed by a process such as compression molding, lamination, or screen printing. In some embodiments, the molding member 181 may cover the side surfaces of the semiconductor chip 170 and may expose the upper surface (i.e., a main surface opposite the aforementioned lower surface) of the semiconductor chip 170 to the outside. The molding member 181 may constitute an external shape of the semiconductor package 10, and a redistribution layer structure 140 may extend from the molding member 181.

An upper pad 161 and an upper protective layer 151 surrounding the upper pad 161 may be disposed under the solder bump 175. The upper pad 161 may be located in an opening of the upper protective layer 151. In some embodiments, the upper protective layer 151 may include an inorganic insulating material, an organic insulating material, or an insulating material composed of a combination thereof.

The redistribution layer structure 140 may include a single layer or a plurality of layers of a metal wiring layer. For example, the redistribution layer structure 140 may be formed of copper (Cu), nickel (Ni), gold (Au), chromium (Cr), titanium (Ti), or palladium (Pd), or an alloy thereof. In some embodiments, the redistribution layer structure 140 may be formed by an electroplating process.

The redistribution layer structure 140 may include tapered inverted trapezoidal vias and redistribution layer lines 141 to 144 (e.g., 141, 142, 143 and 144) contacting upper surfaces of the vias. Each of the redistribution layer lines 141 to 144 may be disposed along a plane formed in a first direction (X direction) and a second direction (Y direction) perpendicular to the first direction (X direction). In addition, the redistribution layer lines 141 to 144 may be arranged as a plurality of layers in a third direction (Z direction) perpendicular to both the first direction (X direction) and the second direction (Y direction). The width of the via may be formed in a shape that narrows away from the semiconductor chip 170 along the third direction (Z direction). This may be a characteristic according to a last chip-manufacturing method in which the semiconductor chip 170 is later mounted on the redistribution layer structure 140.

The redistribution layer structure 140 may include redistribution layer lines 141 to 144 composed of four layers between the insulating layers 130. However, the redistribution layer structure 140 may include more or fewer layers than redistribution layer lines 141 to 144.

The redistribution layer lines 141 to 144 may electrically connect the bump pad 123 to the electrode pad 173 of the semiconductor chip 170. For example, a solder bump 175 is disposed between an electrode pad 173 and an upper pad 161 of the semiconductor chip 170, so that the electrode pad 173 and the upper pad 161 may be electrically connected to each other. The first redistribution layer line 141 is disposed under the upper pad 161, and the upper pad 161 and the first redistribution layer line 141 may be directly connected to each other. The second redistribution layer line 142 may be disposed under the first redistribution layer line 141, and the first redistribution layer line 141 and the second redistribution layer line 142 may be directly connected to each other. In the same manner, a third redistribution layer line 143 is disposed under the second redistribution layer line 142, and a fourth redistribution layer line 144 is disposed under the third redistribution layer line 143 to be directly connected to each other. Here, the bump pad 123 is disposed under the fourth redistribution layer line 144, and the fourth redistribution layer line 144 and the bump pad 123 may be directly connected to each other.

In addition, the insulating layer 130 may include an insulating layer or insulating layers around the redistribution layer structure 140. The insulating layer 130 may for example be formed of polymer, benzocyclobutene, or resin, and may be formed of photosensitive polyimide. Therefore, the insulating layer 130 may be referred to as a polymer layer. However, the material constituting the insulating layer 130 is not limited thereto. For example, the insulating layer 130 may be made of silicon oxide or silicon nitride.

In relation to the insulating layer 130, a first insulating layer 131 is disposed under the upper protective layer 151, and the first insulating layer 131 may include an opening that exposes a portion of the upper surface of the first redistribution layer line 141. A second insulating layer 132 is disposed under the first insulating layer 131, and the second insulating layer 132 may include an opening that exposes a portion of the upper surface of the second redistribution layer line 142. Similarly, a third insulating layer 133 may be disposed under the second insulating layer 132, a fourth insulating layer 134 may be disposed under the third insulating layer 133, and a fifth insulating layer 135 may be disposed under the fourth insulating layer 134. The lower protective layer 111 is disposed under the fifth insulating layer 135, and the lower protective layer 111 may include an opening that exposes the lower surface of the bump pad 123.

The bump pad 123 is electrically connected to an individual unit element of the semiconductor chip 170 through the redistribution layer structure 140, so that the function of the circuit part of the semiconductor chip 170 may be electrically connected to the bump structure 191. That is, the bump pad 123 may also be referred to as an under bump metal (UBM). In some embodiments, the bump pad 123 may be a copper (Cu) pad. Further, a thickness 123H of the bump pad 123 may be about 3 μm to about 15 μm, but is not limited thereto. The semiconductor package 10 may include a plurality of bump pads 123.

The bump pad 123 may include an upper structure 123T that may contact the fourth redistribution layer line 144 of the redistribution layer structure 140, and a lower structure 123B contacting the bump structure 191. A first width W1 of the upper structure 123T in the bump pad 123 may be greater than a second width W2 of the lower structure 123B. That is, the bump pad 123 has a T shape, and a side surface of the bump pad 123 may have a step difference. In some embodiments, the numerical value of the first width W1 may be determined to be in a range that satisfies a numerical value greater than the numerical value of the second width W2 plus about 2 μm, and satisfies a numerical value less than four times the numerical value of the second width W2. However, the numerical value of the first width W1 is not limited thereto. The lower (second) structure 123B may be characterized as extending or protruding from the upper (first) structure 123T.

The upper structure 123T and the lower structure 123B of the bump pad 123 may have a same central axis 123C. That is, the center of the upper structure 123T may be aligned with the center of the lower structure 123B in the third direction (Z direction). In addition, the level of the lower surface of the lower structure 123B may be substantially the same as the level of the lowest surface of the lower protective layer 111. That is, the level of the lower surface of the lower structure 123B and the level of the lowest surface of the lower protective layer 111 may be substantially coplanar. In some embodiments, each of the upper structure 123T and the lower structure 123B of the bump pad 123 may have a cylindrical shape. In other embodiments, each of the upper structure 123T and the lower structure 123B of the bump pad 123 may have any shape, for example, a quadrangular pillar shape.

The metal seed layer 121 may be disposed between the bump pad 123 and the lower protective layer 111. Specifically, the metal seed layer 121 may be conformally disposed on a portion of the side surface of the bump pad 123 and a portion of the upper surface of the lower protective layer 111. The metal seed layer 121 may be formed by a physical vapor deposition process to have a thickness of about 100 Å to about 20,000 Å. The metal seed layer 121 may be formed of for example a metal containing at least one selected from titanium (Ti), titanium tungsten (TiW), and chromium (Cr), or an alloy thereof.

The metal seed layer 121 may function as a seed for forming the bump pad 123. That is, the metal seed layer 121 provides a path through which current may flow when the bump pad 123 is formed by an electroplating process, so that the bump pad 123 is formed on the metal seed layer 121. In some embodiments, the metal seed layer 121 and the bump pad 123 may be made of different materials. For example, the metal seed layer 121 may be formed of titanium (Ti), and the bump pad 123 may be formed of copper (Cu). In this case, the metal seed layer 121 and the bump pad 123 may form an interface.

The metal seed layer 121 may be disposed along the lower surface of the upper structure 123T and the side surface of the lower structure 123B of the bump pad 123. A first undercut 121C1 may be formed at one end of the metal seed layer 121 in contact with the upper structure 123T, and a second undercut 121C2 may be formed at the other end of the metal seed layer 121 contacting the lower structure 123B. The first undercut 121C1 may be formed in (or along) a first direction (X direction), and the second undercut 121C2 may be formed in (or along) a third direction (Z direction). That is, the first undercut 121C1 and the second undercut 121C2 may be perpendicular to each other, or in other words extend orthogonally with respect to each other. Here, the first length C1 of the first undercut 121C1 may be up to about 2 μm, and the second length C2 of the second undercut 121C2 may be up to about 3 μm. However, in other embodiments the first and second undercuts may have different lengths.

The bump structure 191 may include a solder ball or a solder bump. In some embodiments, lead free solder including tin (Sn) may for example be used as a material constituting the bump structure 191. Through the bump structure 191, the semiconductor package 10 may be connected to an external device such as a printed circuit board (PCB). The bump structure 191 may be electrically connected to the redistribution layer structure 140 through the bump pad 123.

In some embodiments, the bump structure 191 may have a third width W3 that is greater than the second width W2 of the lower structure 123B. In this case, the first undercut 121C1 may be filled by the insulating layer 130, and the second undercut 121C2 may be filled by the bump structure 191. The bump structure 191 may be disposed so as to contact the lower surface of the lower structure 123B, and may be disposed not to contact the lower surface of the lower protective layer 111. Further, the bump structure 191 may contact the side surface of the lower structure 123B and the side surface of the lower protective layer 111 through the second undercut 121C2.

In response to the rapid development of the electronics industry and so as to meet the needs of users, electronic devices are becoming more compact and multifunctional. Accordingly, the need for miniaturization and multifunctionalization of semiconductor chips such as the semiconductor chip 170 used in an electronic device is also increasing. As a result, it is required that semiconductor chips such as the semiconductor chip 170 have a fine (or reduced) pitch connection terminal, and micro-sized electrode pads 173 to mount the high-capacity semiconductor chip 170 within a structure of semiconductor package 10 having limited size. Consequently, redistribution layer structure 140 for electrically connecting the bump structure 191 (which is an external connection terminal) to the electrode pad 173 having fine (or small) size included in the semiconductor package 10 is required. However, during manufacturing of the semiconductor package 10 using ultra-fine processing recently developed, there is a problem that the bump structure 191 falls off due to a peeling phenomenon between the bump pad 123 and the lower protective layer 111.

In embodiments of the inventive concepts, peeling defects in the semiconductor package 10 that may occur between the bump pad 123 and the lower protective layer 111 may be reduced by forming the bump pad 123 as having a T shape, and by forming the metal seed layer 121 between the bump pad 123 and the lower protective layer 111. In addition, the bonding strength of the bump pad 123 and the bump structure 191 may be increased through the second undercut 121C2 of the metal seed layer 121.

Consequently, the semiconductor package 10 according to embodiments of the inventive concepts may have improved reliability, and productivity of manufacturing may be improved while reducing overall cost.

Figure 5:
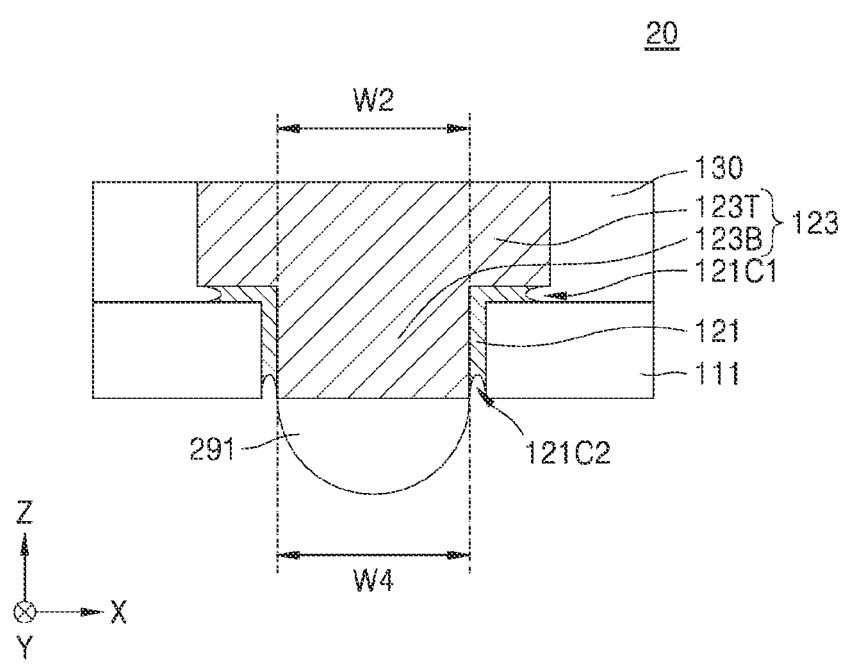
FIG. 5 illustrates an enlarged cross-sectional view of a portion of a semiconductor package according to embodiments of the inventive concepts.
Figure 6:
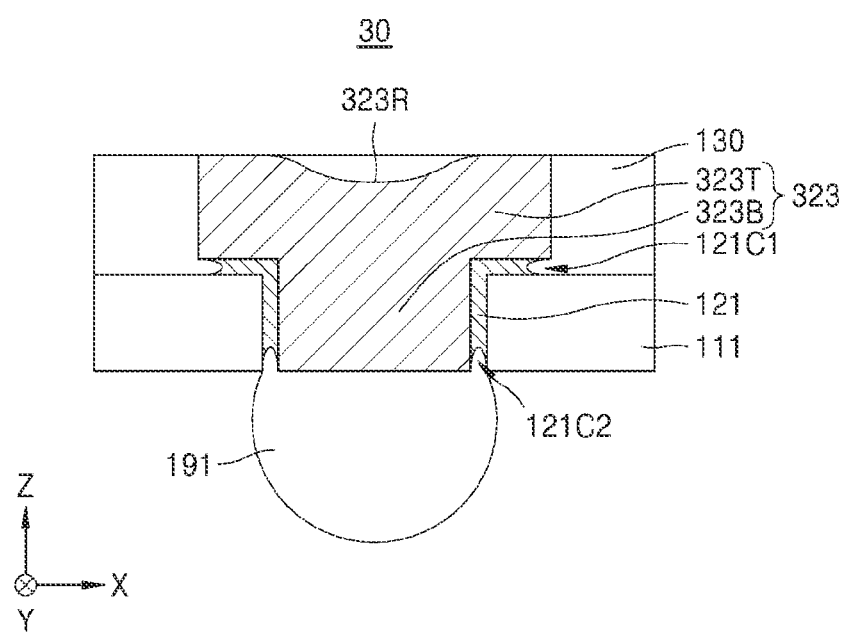
FIG. 6 illustrates an enlarged cross-sectional view of a portion of a semiconductor package according to other embodiments of the inventive concepts.
Figure 7:
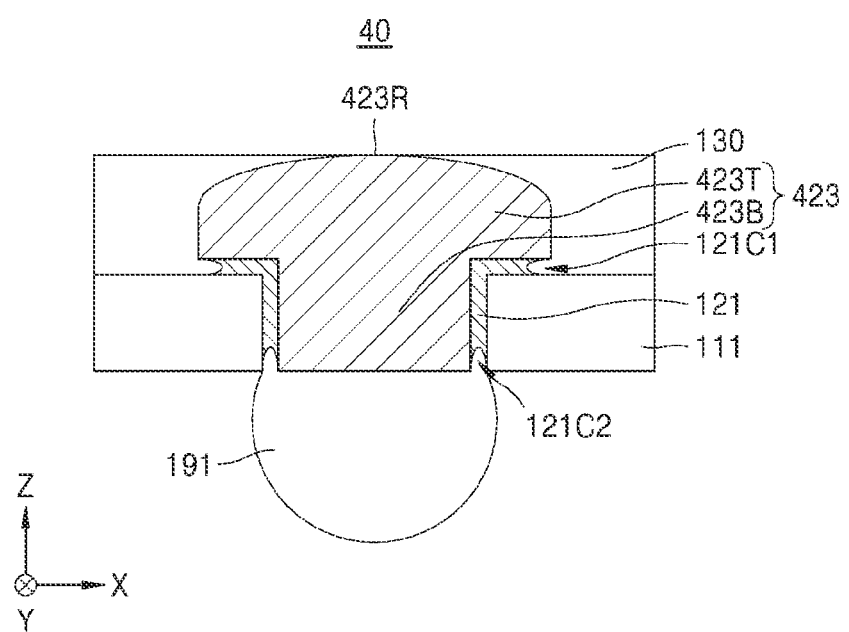
FIG. 7 illustrates an enlarged cross-sectional view of a portion of a semiconductor package according to still further embodiments of the inventive concepts.

FIGS. 5, 6 and 7 illustrate enlarged cross-sectional views of a portion of semiconductor packages according to other embodiments of the inventive concepts.

Most of the components constituting semiconductor packages 20, 30, and 40 described hereinafter and the materials constituting the components are substantially the same or similar to those described with reference to FIGS. 1 to 4. Accordingly, for the sake of convenience the following description will be mainly focused on differences between the semiconductor packages 20, 30 and 40 and the semiconductor package 10.

Referring to FIG. 5, the semiconductor package 20 includes a bump structure 291 attached to a lower surface of the bump pad 123 as shown.

The bump structure 291 included in the semiconductor package 20 may include a solder ball or a solder bump. Through the bump structure 291, the semiconductor package 20 may be connected to an external device such as a PCB. The bump structure 291 may be electrically connected to the redistribution layer structure 140 (see FIG. 1) through the bump pad 123.

In some embodiments, the bump structure 291 may have a fourth width W4 equal to or less than the second width W2 of the lower structure 123B. In this case, the first undercut 121C1 may be filled by the insulating layer 130, and the second undercut 121C2 may remain empty. The bump structure 291 may be disposed to contact the lower surface of the lower structure 123B, but may be disposed not to contact the lower protective layer 111. In addition, the bump structure 291 may be spaced apart from the side surface of the lower structure 123B and the side surface of the lower protective layer 111 by the second undercut 121C2.

Referring to FIG. 6, the semiconductor package 30 includes a bump pad 323 having an upper surface that is concavely round as shown.

The bump pad 323 may include an upper structure 323T contacting the redistribution layer structure 140 (see FIG. 1) and a lower structure 323B contacting the bump structure 191. The width of the upper structure 323T of the bump pad 323 may be greater than the width of the lower structure 323B. That is, the bump pad 323 has a T shape, and a side surface of the bump pad 323 may have a step difference.

The upper structure 323T of the bump pad 323 may be formed to have a concave surface 323R. That is, a portion of the upper surface of the upper structure 323T may be concave. This may be a characteristic resulting from the process of forming the bump pad 323.

Referring to FIG. 7, the semiconductor package 40 includes a bump pad 423 having an upper surface that is convexly round as shown.

The bump pad 423 may include an upper structure 423T contacting the redistribution layer structure 140 (see FIG. 1) and a lower structure 423B contacting the bump structure 191. The width of the upper structure 423T of the bump pad 423 may be greater than the width of the lower structure 423B of the bump pad 423. That is, the bump pad 423 has a T shape, and a side surface of the bump pad 423 may have a step difference.

The upper structure 423T of the bump pad 423 may be formed to have a convex surface 423R. That is, the upper surface of the upper structure 423T may be convex. This may be a characteristic resulting from the process of forming the bump pad 423.

FIGS. 8, 9, 10 and 11 illustrate cross-sectional views of semiconductor packages according to other embodiments of the inventive concepts.

Most of the components constituting semiconductor packages 50, 60, 70, and 80 described hereinafter and the materials constituting the components are substantially the same or similar to those described with reference to FIGS. 1 to 4. Accordingly, for convenience the following description will mainly focus on differences between the semiconductor packages 50, 60, 70 and 80 and the semiconductor package 10.

Figure 8:
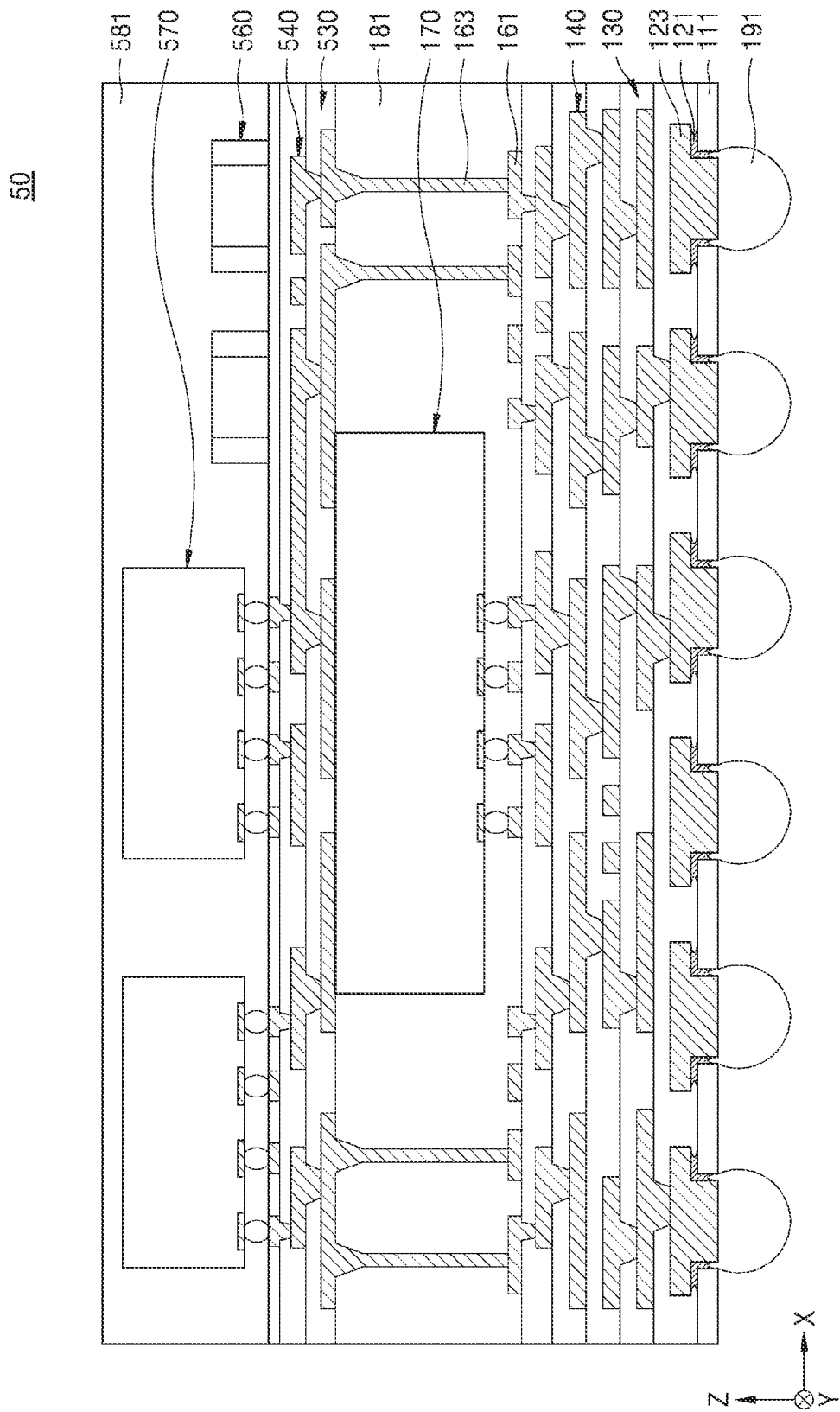
FIG. 8 illustrates a cross-sectional view of a semiconductor package according to embodiments of the inventive concepts.

Referring to FIG. 8, the semiconductor package 50 includes an upper redistribution layer structure 540 formed on an upper surface of the semiconductor chip 170, and a second semiconductor chip 570 mounted on the upper redistribution layer structure 540.

The semiconductor package 50 may include a through electrode 163 passing through the molding member 181. The side surfaces of the semiconductor chip 170 and the through electrode 163 are covered by the molding member 181, and the upper surfaces of the semiconductor chip 170 and the through electrodes 163 are exposed. In some embodiments, after the molding member 181 is formed to cover the semiconductor chip 170 and the through electrode 163, the upper surface of the through electrode 163 may be ground to be exposed to the outside. In other embodiments, after forming the molding member 181 to cover the semiconductor chip 170, and then forming a through hole in the molding member 181 through an exposure process and an etching process, a through electrode 163 is formed to fill the through hole.

The semiconductor package 50 may include a passive element 560 and the second semiconductor chip 570. After forming the upper redistribution layer structure 540 electrically connected to the through electrode 163, the passive element 560 and the second semiconductor chip 570 may be mounted on the upper redistribution layer structure 540. The semiconductor package 50 may include a plurality of second semiconductor chips 570 and a plurality of passive elements.

The upper insulating layer 530 may be disposed to surround the upper redistribution layer structure 540, and a second molding member 581 may be disposed to surround the passive element 560 and the second semiconductor chip 570.

Figure 9:
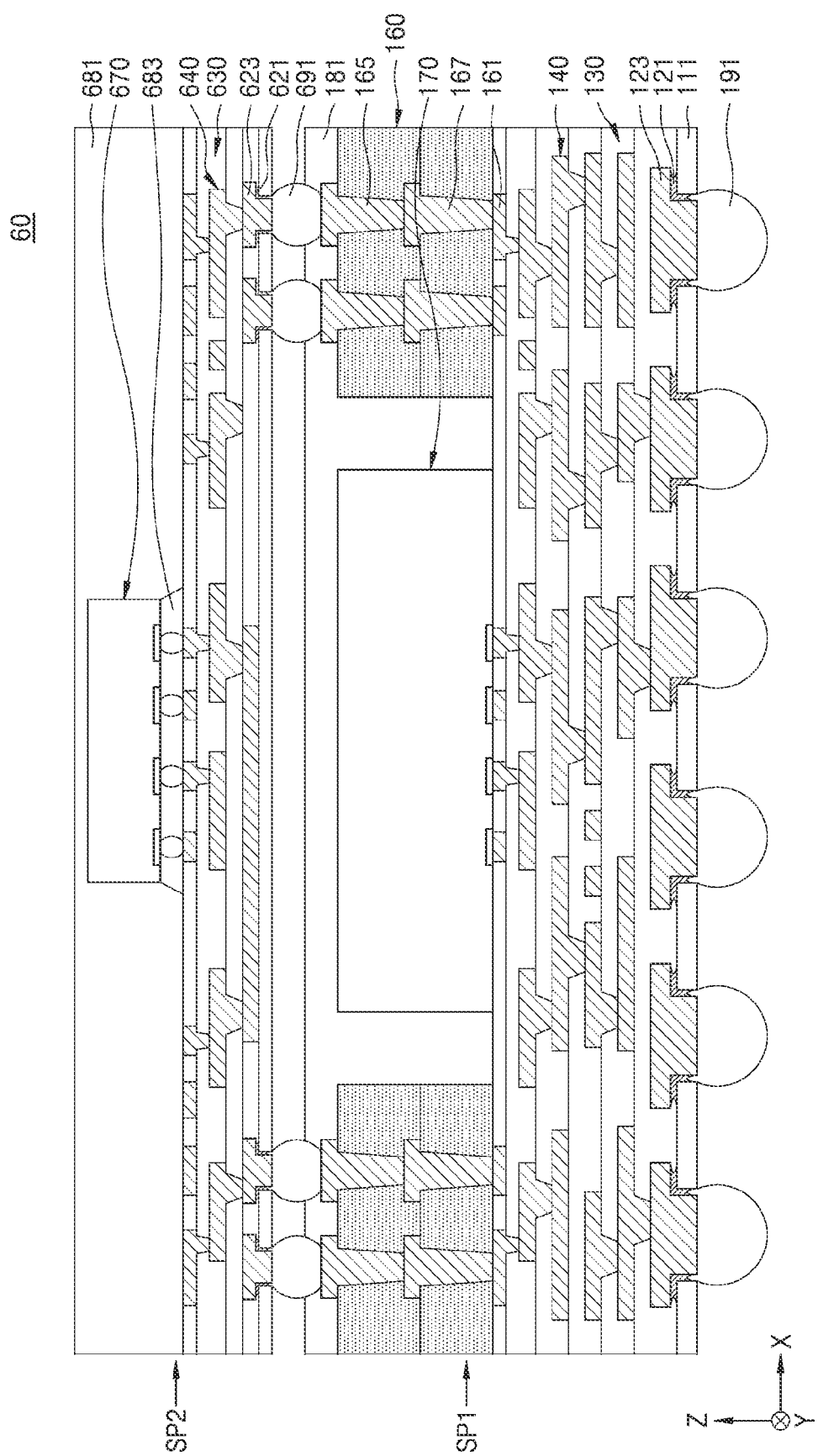
FIG. 9 illustrates a cross-sectional view of a semiconductor package according to other embodiments of the inventive concepts.

Referring to FIG. 9, the semiconductor package 60 includes a second semiconductor chip 670 mounted in a sub-package form on an upper portion of the semiconductor chip 170.

The semiconductor package 60 includes both a fan-out panel level package (FO-PLP) structure and a package on package (PoP) structure. That is, a first sub-package SP1 including the semiconductor chip 170 and a second sub-package SP2 including the second semiconductor chip 670 are connected by an inter-package connection structure 691 to configure one semiconductor package. For example, the semiconductor chip 170 may include a controller semiconductor chip, and the second semiconductor chip 670 may include a memory semiconductor chip.

The first sub-package SP1 may include a frame structure 160 surrounding a side surface of the semiconductor chip 170. The frame structure 160 is a configuration for supporting the semiconductor package 60, and through this, rigidity may be maintained and uniformity of thickness may be secured. The frame structure 160 has an upper surface and a lower surface facing the upper surface, and a through region is formed to penetrate between the upper surface and the lower surface thereof. In the through region, the semiconductor chip 170 is disposed to be spaced apart from the frame structure 160, and as a result, the side surface periphery of the semiconductor chip 170 is surrounded by the frame structure 160.

The material of the frame structure 160 is not particularly limited as long as it may support the semiconductor package 60. For example, an insulating material, metal having excellent stiffness and thermal conductivity, glass, ceramic, plastic, or the like may be used. The thickness of the frame structure 160 is not particularly limited, and may be designed according to the thickness of the semiconductor chip 170. For example, depending on the type of the semiconductor chip 170, the thickness of the frame structure 160 may be about 100 μm to about 500 μm. The frame structure 160 may have a large size having a plurality of through regions for mass production of the semiconductor package 60, and may thus be manufactured using a method of singulating the individual semiconductor package 60 through a sawing process after manufacturing a plurality of semiconductor packages 60.

The frame structure 160 may include through electrodes 165 and 167 penetrating the inside thereof. The through electrodes 165 and 167 may penetrate a body of the frame structure 160. The through electrodes 165 and 167 may include a lower through electrode 167 and an upper through electrode 165, but the specific number, spacing, arrangement type, etc. are not particularly limited, and sufficient modifications may be made according to design. The frame structure 160 may thus be characterized as including through electrodes that are a plurality of wiring layers formed as a multi-stage structure.

The through electrodes 165 and 167 may be electrically connected to the inter-package connection structure 691.

The second sub-package SP2 may include a second semiconductor chip 670, a second redistribution layer structure 640 disposed under the second semiconductor chip 670, a second bump pad 623 disposed under the second redistribution layer structure 640, a second metal seed layer 621 disposed along a portion of the side surface of the second bump pad 623, and a second insulating layer 630 surrounding the second redistribution layer structure 640 and the second bump pad 623. In addition, the second sub-package SP2 may include an underfill 683 to reinforce the connection between the second semiconductor chip 670 and the solder ball, and may include a molding member 681 that protects the second semiconductor chip 670 from external influences such as contamination and impact.

The second bump pad 623 may be substantially the same as the bump pad 123, and the second metal seed layer 621 may be substantially the same as the metal seed layer 121. That is, in the semiconductor package 60 according to embodiments of the inventive concepts, features included in the first sub-package SP1 may also be applied to the second sub-package SP2.

Figure 10:
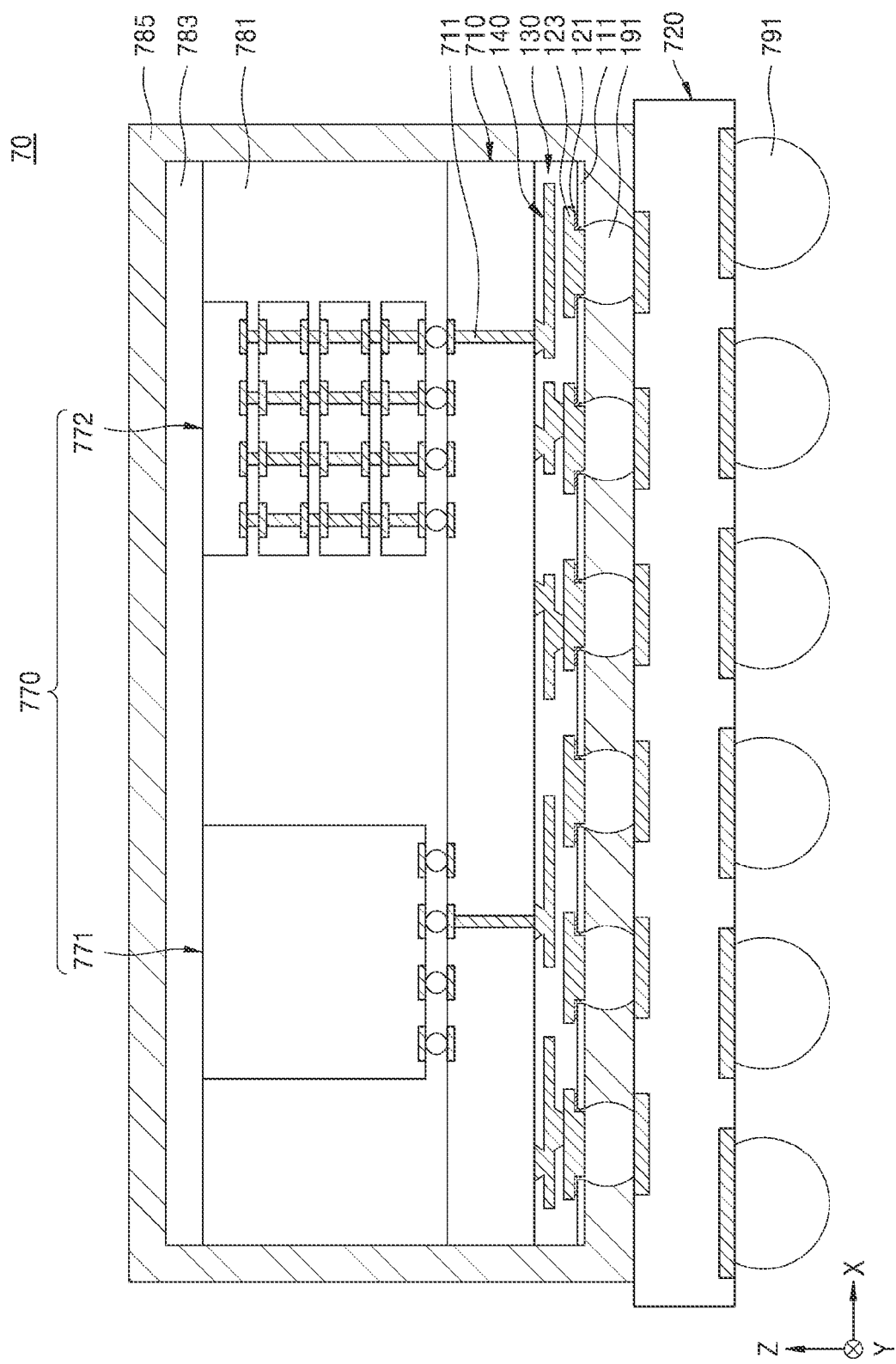
FIG. 10 illustrates a cross-sectional view of a semiconductor package according to further embodiments of the inventive concepts.

Referring to FIG. 10, the semiconductor package 70 includes a package substrate 720, an interposer 710 disposed on the package substrate 720, and semiconductor chip(s) 770 disposed on the interposer 710.

The package substrate 720 included in the semiconductor package 70 may be a PCB, a wafer substrate, a ceramic substrate, a glass substrate, or the like. In the semiconductor package 70 according to embodiments of the inventive concepts, the package substrate 720 may be a PCB.

An external terminal 791 may be disposed on the lower surface of the package substrate 720. The semiconductor package 70 may be electrically connected to and mounted on a module board or a system board of an electronic product through the external terminal 791.

The interposer 710 may include a redistribution layer structure 140, a bump pad 123 connected to a lower portion of the redistribution layer structure 140, and a through electrode 711 connected to an upper portion of the redistribution layer structure 140.

The semiconductor chip(s) 770 may be mounted on the interposer 710. The semiconductor package 70 may include a molding member 781 surrounding the semiconductor chip 770 and a heat dissipation member 783 on the molding member 781. In addition, the semiconductor package 70 may include an encapsulation 785 surrounding the interposer 710, the molding member 781, and the heat dissipation member 783.

The semiconductor chip(s) 770 may include a first semiconductor chip 771 and a second semiconductor chip 772. The first semiconductor chip 771 includes a single logic chip, and may for example be implemented as a microprocessor, a graphics processor, a signal processor, a network processor, a chipset, an audio codec, a video codec, an application processor, or a system on chip (SoC). The second semiconductor chip 772 may include a high bandwidth memory chip in which a plurality of slices form a stacked structure. In some embodiments semiconductor chip(s) 770 may include any number of the first semiconductor chip 771 and the second semiconductor chip 772.

Figure 11:
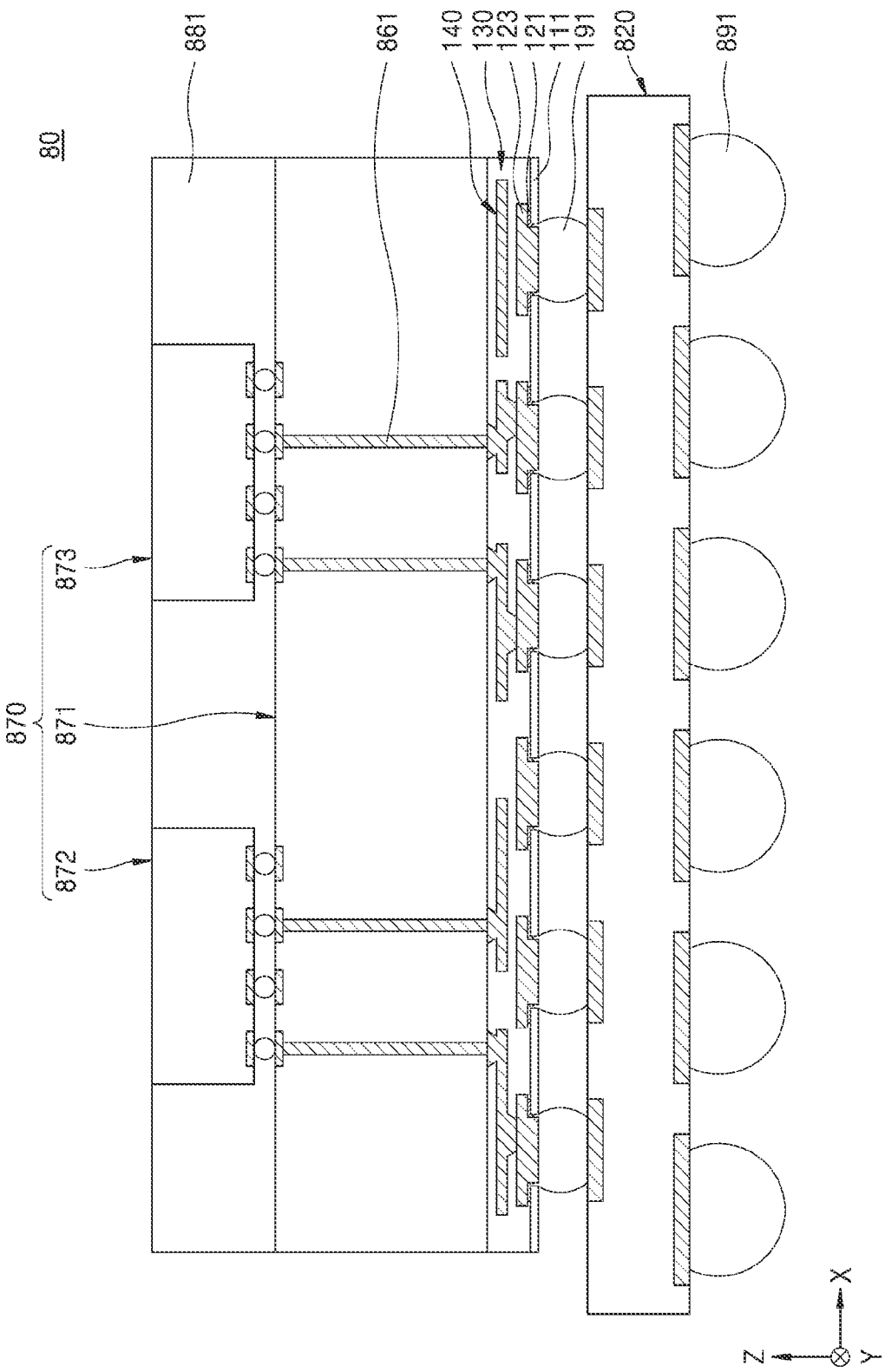
FIG. 11 illustrates a cross-sectional view of a semiconductor package according to still further embodiments of the inventive concepts.

Referring to FIG. 11, a semiconductor package 80 includes a package substrate 820, a first semiconductor chip 871 disposed on the package substrate 820, and a plurality of second semiconductor chips 872 and 873 disposed on the first semiconductor chip 871.

The package substrate 820 included in the semiconductor package 80 may be a PCB, a wafer substrate, a ceramic substrate, a glass substrate, or the like. In the semiconductor package 80 according to embodiments of the inventive concepts, the package substrate 820 may be a PCB.

An external terminal 891 may be disposed on the lower surface of the package substrate 820. The semiconductor package 80 may be electrically connected to and mounted on a module board or a system board of an electronic product through the external terminal 891.

The semiconductor chip(s) 870 may include the first semiconductor chip 871 and the plurality of second semiconductor chips 872 and 873. The first semiconductor chip 871 may include a redistribution layer structure 140. In addition, the first semiconductor chip 871 may include a bump pad 123 connected to a lower portion of the redistribution layer structure 140 and a through electrode 861 connected to an upper portion of the redistribution layer structure 140. The plurality of second semiconductor chips 872 and 873 may be mounted on the first semiconductor chip 871, and the side surfaces of the plurality of second semiconductor chips 872 and 873 may be surrounded by a molding member 881.

The first semiconductor chip 871 includes a single logic chip, and may for example be implemented as a microprocessor, a graphics processor, a signal processor, a network processor, a chipset, an audio codec, a video codec, an application processor, or a system on chip. The plurality of second semiconductor chips 872 and 873 may for example include a volatile memory chip and/or a nonvolatile memory chip.

Figure 12:
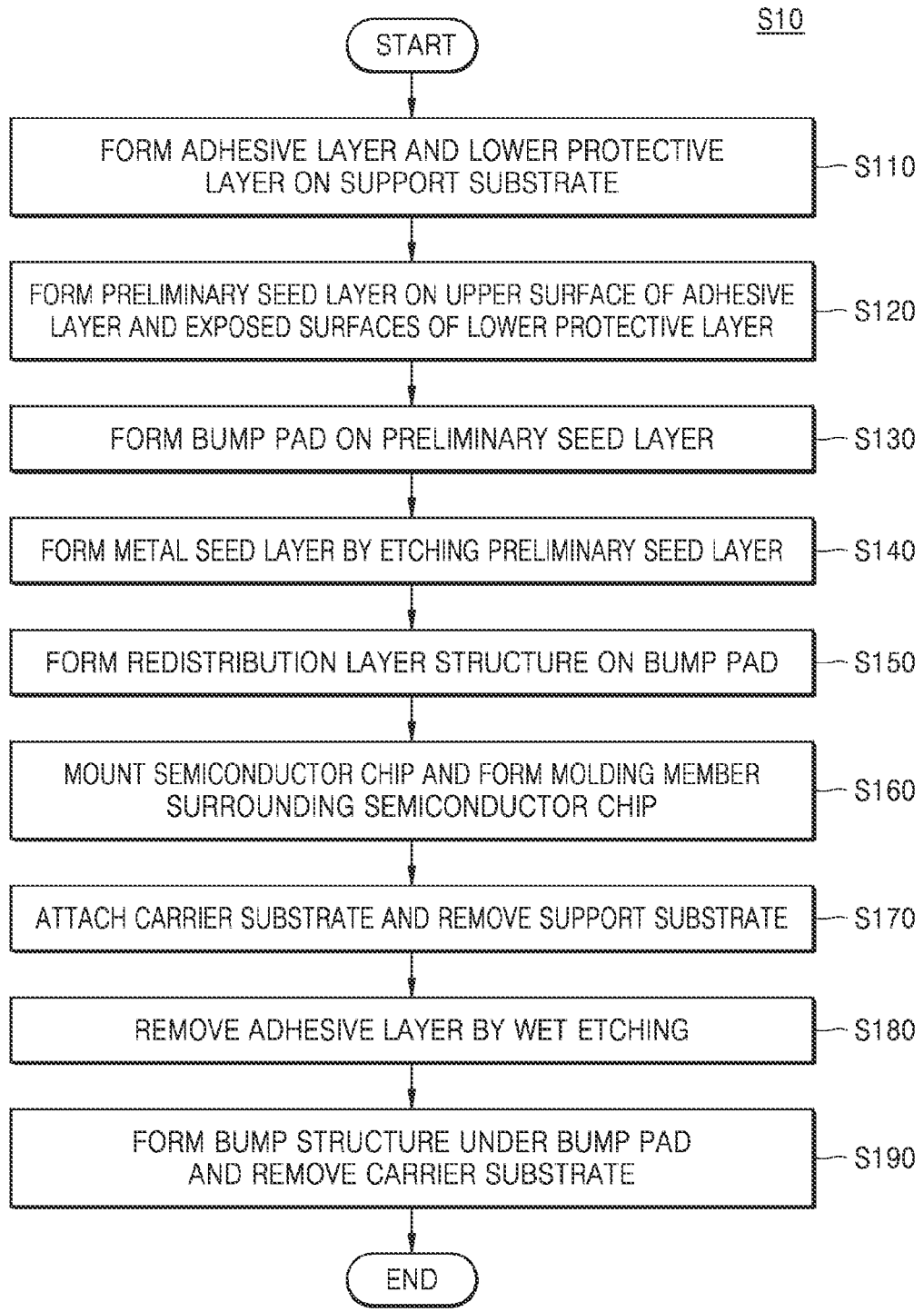
FIG. 12 illustrates a block diagram descriptive of a method of manufacturing a semiconductor package according to embodiments of the inventive concepts.

FIG. 12 illustrates a block diagram descriptive of a method of manufacturing a semiconductor package according to embodiments of the inventive concepts.

Referring to FIG. 12, the method (S10) of manufacturing a semiconductor package may include a process sequence of first to ninth steps (S110 to S190).

The method (S10) of manufacturing a semiconductor package according to embodiments of the inventive concepts may include a first step of forming an adhesive layer and a lower protective layer on a support substrate (S110), a second step of forming a preliminary seed layer on the upper surface of the adhesive layer and the exposed surfaces of the lower protective layer (S120), a third step of forming a bump pad on the preliminary seed layer (S130), a fourth step of forming a metal seed layer by wet etching the preliminary seed layer (S140), a fifth step of forming a redistribution layer structure on the bump pad (S150), a sixth step of mounting a semiconductor chip and forming a molding member surrounding the semiconductor chip (S160), a seventh step of attaching a carrier substrate and removing the support substrate (S170), an eighth step of removing the adhesive layer by wet etching (S180), and a ninth step of forming a bump structure under the bump pad, and removing the carrier substrate (S190).

In some embodiments, the specific process order of the steps shown in FIG. 12 may be performed differently from the described order. For example, where appropriate two processes described in succession may be performed substantially simultaneously, or may be performed in an order opposite to that described.

Technical features of each of the first to ninth steps (S110 to S190) will be described in detail with reference to FIGS. 13 to 29.

FIGS. 13 to 29 illustrate cross-sectional views descriptive of a method of manufacturing a semiconductor package according to embodiments of the inventive concepts according to a process sequence.

Figure 13:
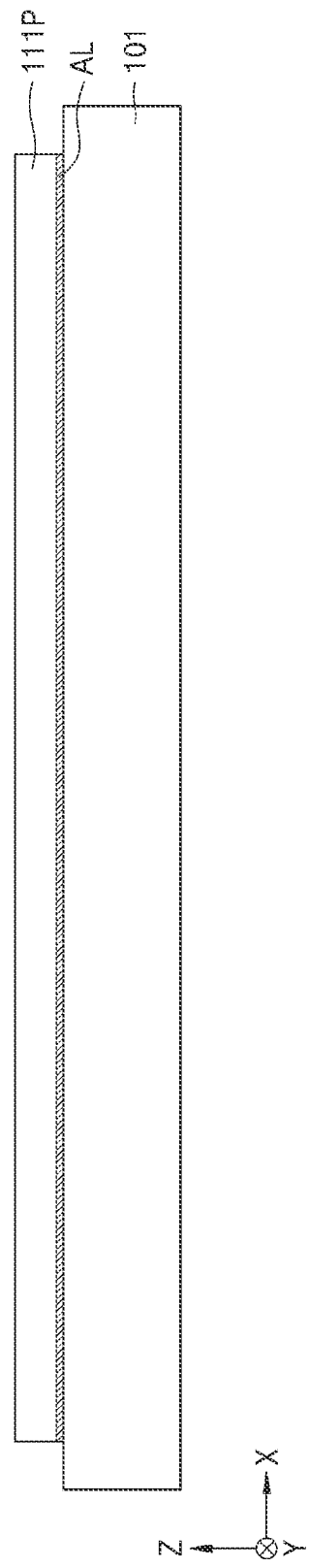
FIGS. 13, 14, 15, 16, 17, 18, 19, 20, 21, 22, 23, 24, 25, 26, 27, 28 and 29 illustrate cross-sectional views descriptive of a method of manufacturing a semiconductor package according to embodiments of the inventive concepts according to a process sequence.

Referring to FIG. 13, an adhesive layer AL and a preliminary protective layer 111P are sequentially formed on the support substrate 101.

In forming the semiconductor package 10 (see FIG. 1), the support substrate 101 may be used to support various material layers, and may be removed from the semiconductor package 10 (see FIG. 1) later.

The support substrate 101 may support an insulating layer and a conductive layer, and may be made of a material having stability against a baking process and an etching process. In some embodiments, when the support substrate 101 is to be separated and removed by laser ablation subsequently, support substrate 101 may be a translucent substrate. In other embodiments, when the support substrate 101 is to be separated and removed later by heating, support substrate 101 may be a heat-resistant substrate.

In some embodiments, the support substrate 101 may be a glass substrate. In other embodiments, the support substrate 101 may be made of a heat-resistant organic polymer material such as for example polyimide, polyetheretherketone, polyethersulfone, polyphenylene sulfide, or the like, but is not limited to such material.

An adhesive layer AL may be provided on the support substrate 101. The adhesive layer AL may allow the support substrate 101 to be separated from the semiconductor package 10 (see FIG. 1). The adhesive layer AL may include a metal material layer. The adhesive layer AL may for example be formed of a metal including at least one selected from titanium (Ti), titanium tungsten (TiW), and chromium (Cr), or an alloy thereof.

Subsequently, a preliminary protective layer 111P may be formed on the adhesive layer AL. The preliminary protective layer 111P may prevent contamination due to material diffusion between various material layers added in a subsequent process and the adhesive layer AL. Further, the preliminary protective layer 111P may prevent various material layers added in a subsequent process from being affected when the support substrate 101 is separated. The preliminary protective layer 111P may include a photosensitive insulating film such as silicon oxide, silicon nitride, or photo imagable dielectric (PID).

Figure 14:
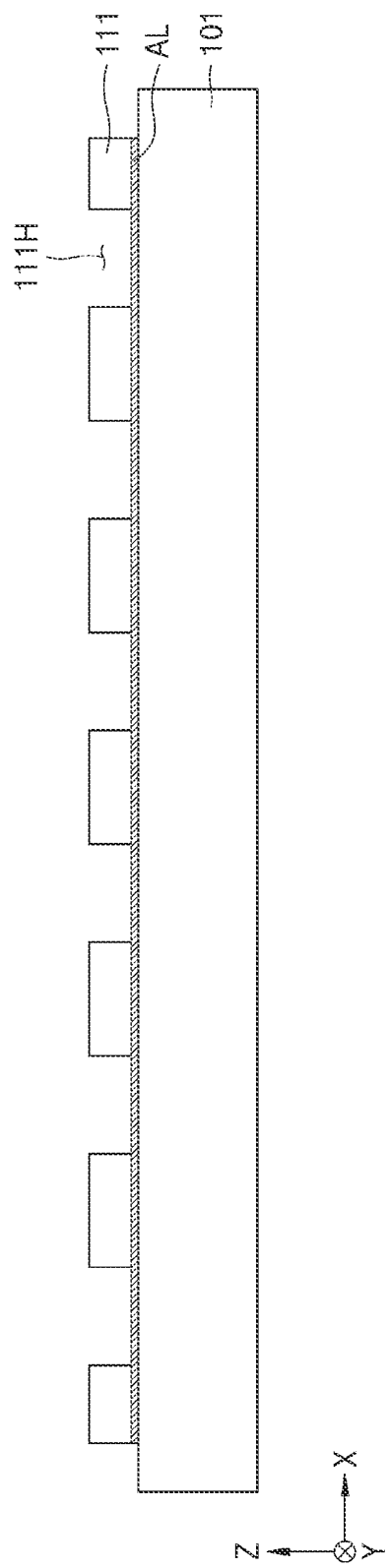

Referring to FIG. 14, a mask pattern (not shown) is formed on the preliminary protective layer 111P (see FIG. 13), and a portion of the preliminary protective layer (111P, see FIG. 13) is etched using the mask pattern as an etch mask, such that the lower protective layer 111 is formed.

After forming the lower protective layer 111, the mask pattern is removed by an ashing and stripping process. The etching may be dry etching. Through the dry etching, a lower protective layer 111 including a plurality of first openings 111H is formed. The first openings 111H may have a sidewall that is substantially perpendicular to the upper surface of the support substrate 101. In this case, the first openings 111H may have a rectangular cross-sectional shape. In other embodiments, due to the nature of the dry etching process, the first openings 111H may have a tapered sidewall that narrows in width rather than vertical sidewalls.

The first openings 111H partially expose the upper surface of the adhesive layer AL. In addition, the exposed portions of the adhesive layer AL viewed from the above may have a circular shape. That is, the lower protective layer 111 may include a plurality of first openings 111H having cylindrical shape.

Figure 15:
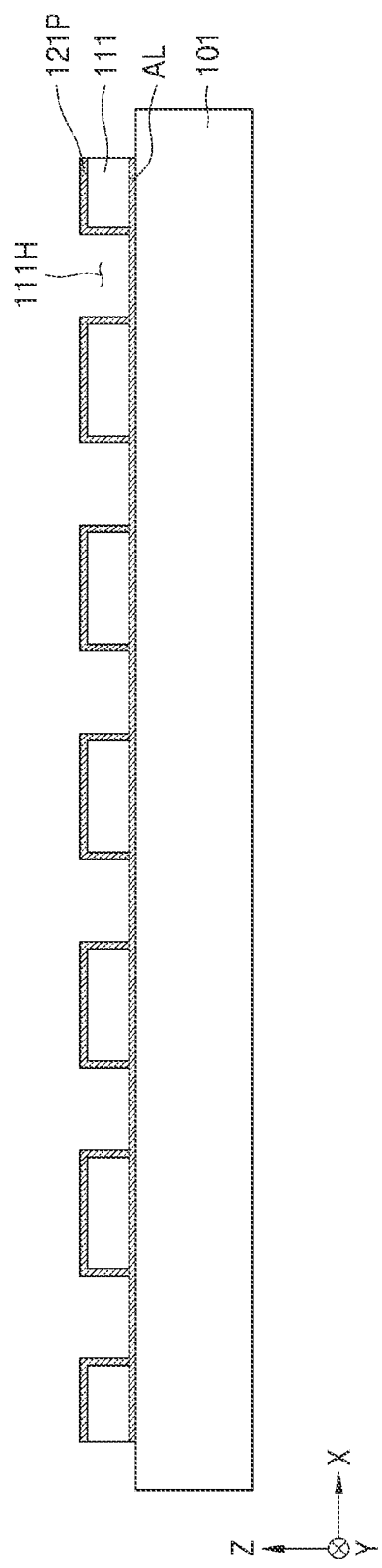

Referring to FIG. 15, the preliminary seed layer 121P is formed by a physical vapor deposition process on the upper surface of the exposed adhesive layer AL and the exposed surfaces of the lower protective layer 111 to have a thickness in the range of about 100 Å to about 20,000 Å.

The preliminary seed layer 121P may be formed of for example a metal containing at least one selected from titanium (Ti), titanium tungsten (TiW), and chromium (Cr), or an alloy thereof. That is, the preliminary seed layer 121P may be formed of substantially the same material as the adhesive layer AL. Accordingly, an interface is shown between the preliminary seed layer 121P and the adhesive layer AL, although the interface may appear differently than as illustrated in FIG. 15.

Figure 17:
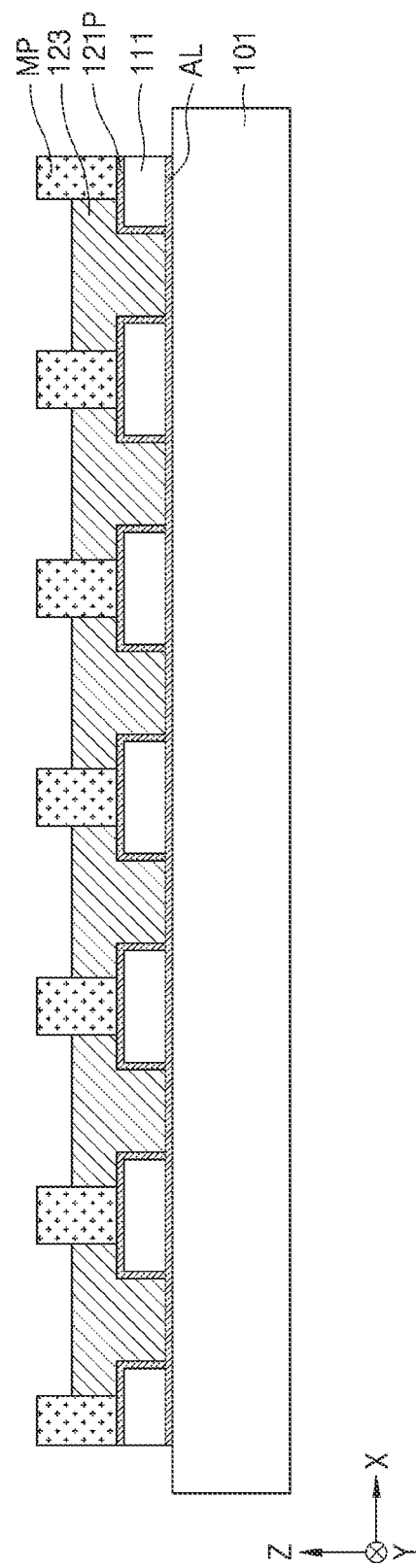

The preliminary seed layer 121P may function as a seed for forming the bump pad 123 (see FIG. 17). That is, when the bump pad 123 (see FIG. 17) is formed by an electroplating method, the preliminary seed layer 121P provides a path through which current may flow, so that the bump pad 123 (see FIG. 17) may be formed on the preliminary seed layer 121P.

The preliminary seed layer 121P may be formed to conformally cover the first openings 111H of the lower protective layer 111. The upper surface of the adhesive layer AL exposed by the first openings 111H corresponds to a portion in direct contact with the preliminary seed layer 121P.

Figure 16:
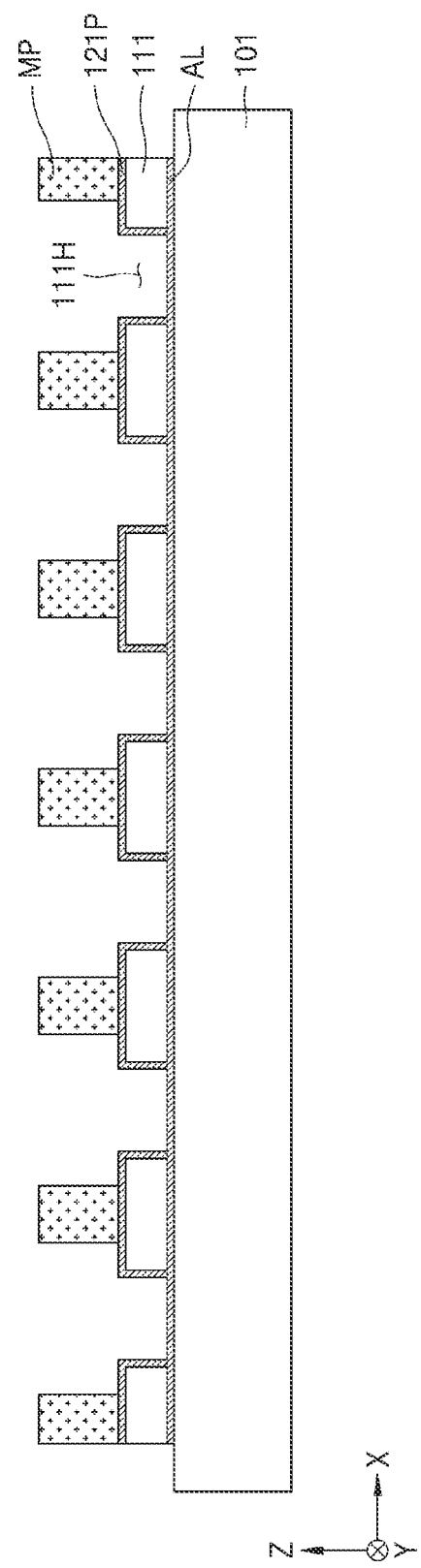

Referring to FIG. 16, a mask pattern MP is formed on the preliminary seed layer 121P.

The mask pattern MP may be formed as having a pattern that exposes a portion of the preliminary seed layer 121P. Because the portion exposed by the mask pattern MP corresponds to a portion where the bump pad 123 (see FIG. 17) is formed in a subsequent process, when a plurality of the bump pads 123 (see FIG. 17) are formed, a plurality of portions exposed by the mask pattern MP may be formed to correspond to the bump pads 123 (see FIG. 17). Hereinafter, the bump pads 123 may be referred to simply as a bump pad 123 for convenience of description.

Referring to FIG. 17, a bump pad 123 is formed on the preliminary seed layer 121P on which the mask pattern MP is formed.

The bump pad 123 may be formed to directly contact the upper surface of the preliminary seed layer 121P exposed by the mask pattern MP. The bump pad 123 may be formed by performing an electroplating process.

In order to form the bump pad 123, the support substrate 101 on which the mask pattern MP is formed may be placed in a bath and electroplating may be performed. The bump pad 123 may be made of for example a metal selected from copper (Cu), nickel (Ni), and gold (Au) or an alloy thereof.

The bump pad 123 may be formed so as not to completely fill the region defined by the mask pattern MP, but only to partially fill the region. That is, the height of the bump pad 123 may be formed lower than the height of the mask pattern MP.

Figure 18:
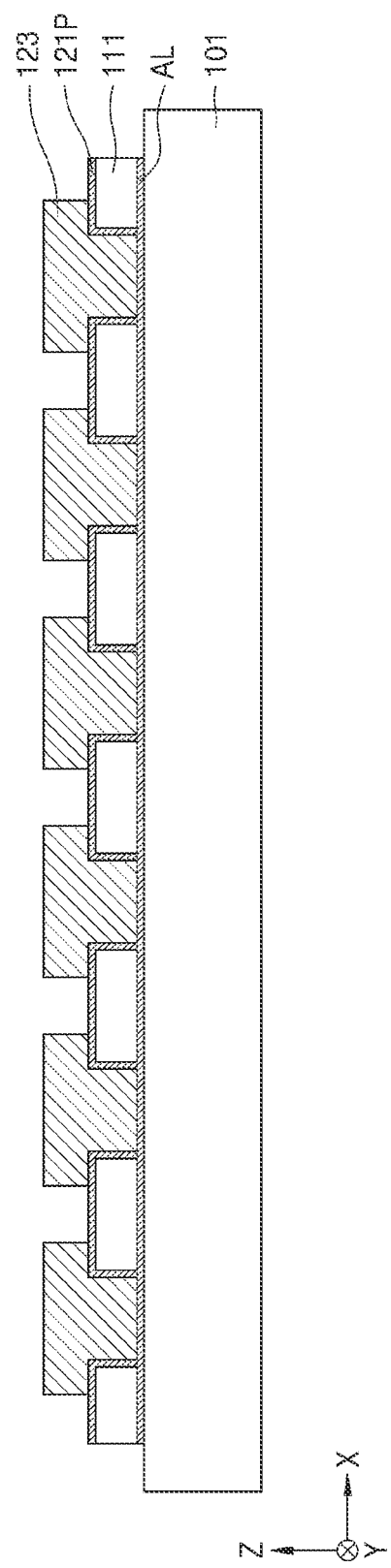

Referring to FIG. 18, an ashing and stripping process is performed, and the mask pattern MP (see FIG. 17) is removed.

Figure 20:
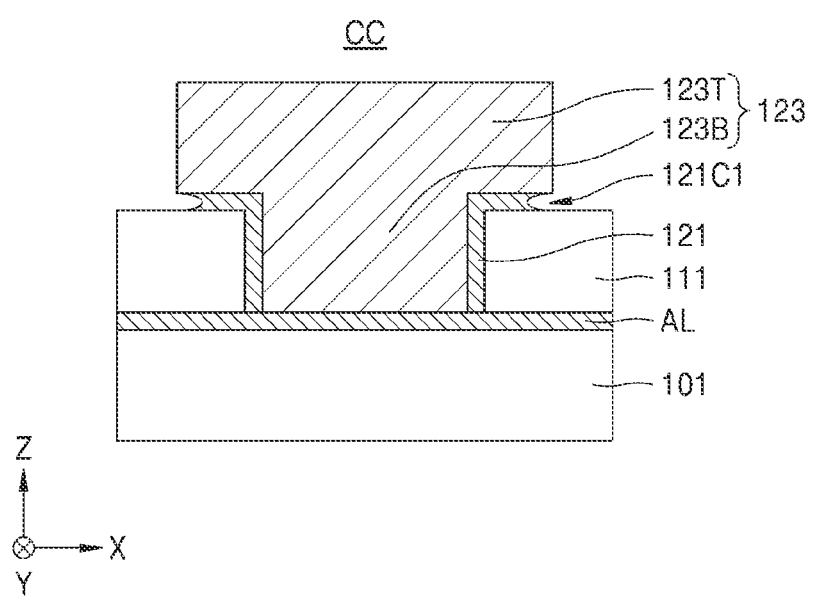

The bump pad 123 may include an upper structure 123T (see FIG. 20) and a lower structure 123B (see FIG. 20). The width of the upper structure 123T (see FIG. 20) of the bump pad 123 may be greater than the width of the lower structure 123B (see FIG. 20) of the bump pad 123. That is, the bump pad 123 has a T shape, and a side surface of the bump pad 123 may have a step difference.

Figure 19:
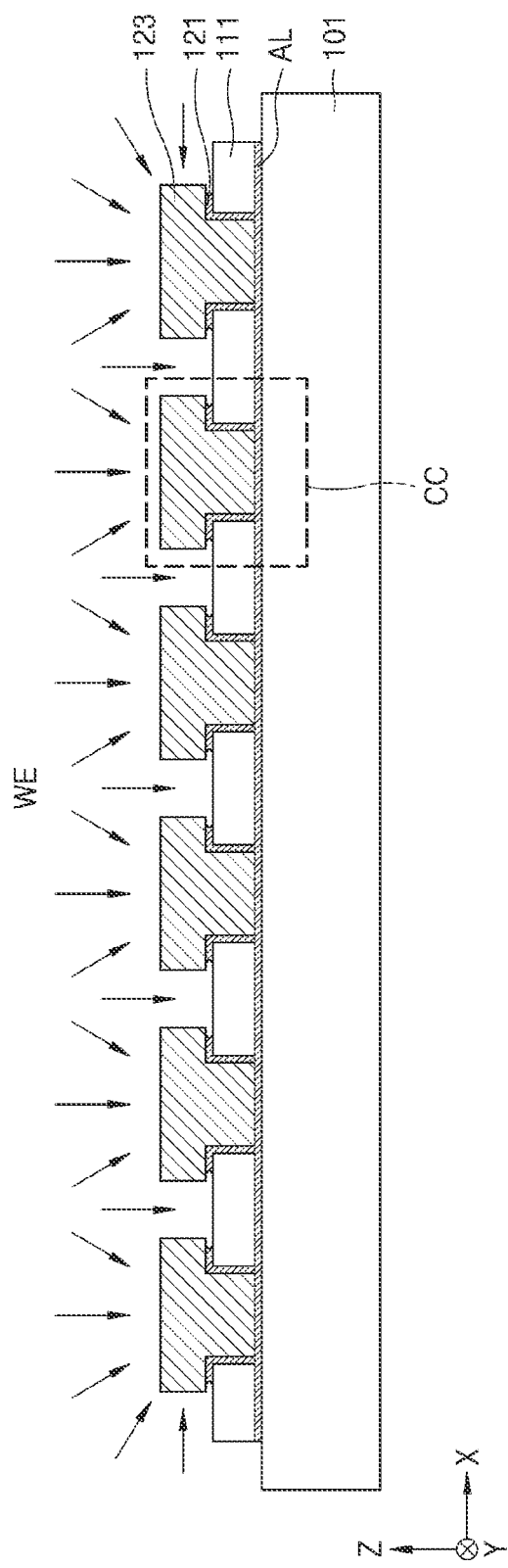

Referring to FIGS. 19 and 20 together, by using the bump pad 123 as an etch mask, the exposed external seed layer 121P (see FIG. 18) that is exposed to the outside is wet-etched WE to form the metal seed layer 121.

The metal seed layer 121 may be disposed along the lower surface of the upper structure 123T and the side surface of the lower structure 123B of the bump pad 123.

When selectively etching the preliminary seed layer 121P (see FIG. 18) by using isotropic wet etching WE, a first undercut 121C1 may be formed at the metal seed layer 121 disposed between the bump pad 123 and the lower protective layer 111. That is, the first undercut 121C1 may be formed at one end of the metal seed layer 121 contacting the upper structure 123T. The first undercut 121C1 may be formed in or along a first direction (X direction).

Figure 21:
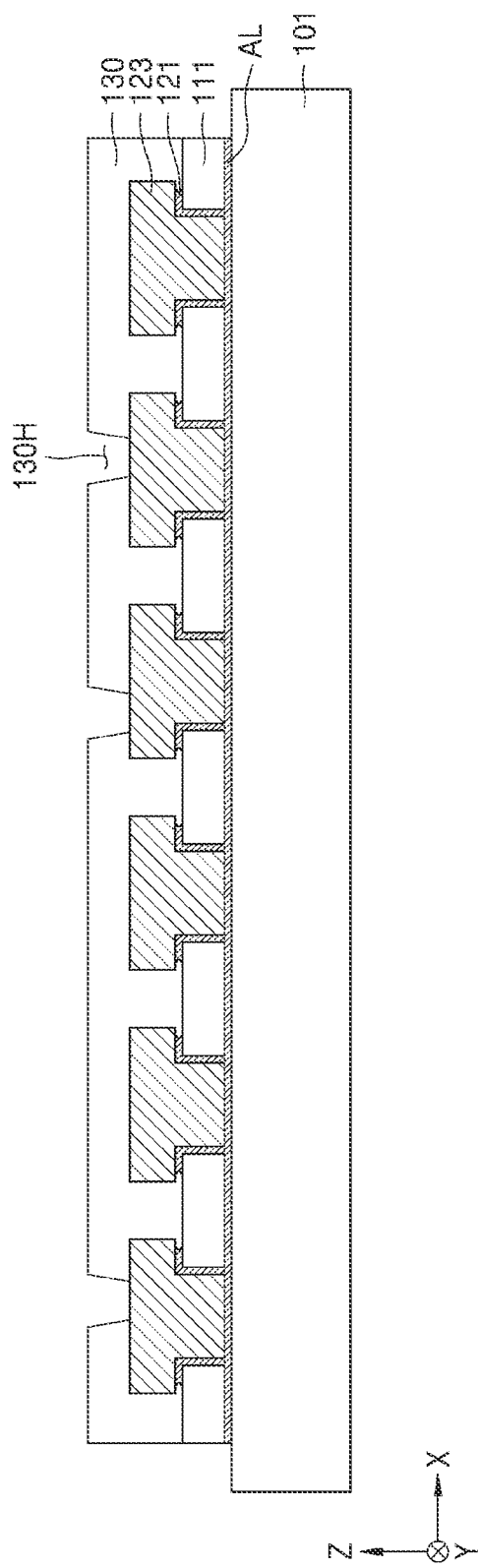

Referring to FIG. 21, an insulating layer 130 is formed on the lower protective layer 111 as filling the periphery of the bump pad 123, and as including a second opening 130H partially exposing the upper surface of the bump pad 123. A plurality of second openings 130H may be formed, and hereinafter the plurality of second openings 130H may be referred to as a second opening 130H for convenience of description.

The insulating layer 130 may be made of silicon oxide or silicon nitride. In some embodiments, the insulating layer 130 may include a photosensitive insulating film such as PID. The photosensitive insulating film has a feature in that it may be formed to have a flat upper surface that does not reflect or have the shape of the lower layer. Therefore, regardless of the shape of the bump pad 123, the insulating layer 130 may have a flat profile. Also, the insulating layer 130 may fill the first undercut 121C1.

The second opening 130H is formed by etching a portion of the insulating layer 130 by using a mask pattern (not shown) as an etching mask, and the mask pattern is removed by an ashing and stripping process.

The etching may be dry etching. Through the dry etching, an insulating layer 130 including a plurality of second openings 130H is formed. Due to the nature of the etching process, the second opening 130H may have a tapered sidewall that narrows downwards rather than a vertical sidewall.

The second opening 130H partially exposes the upper surface of the bump pad 123. In addition, the exposed portion of the bump pad 123 as viewed from above may have a circular shape.

Figure 22:
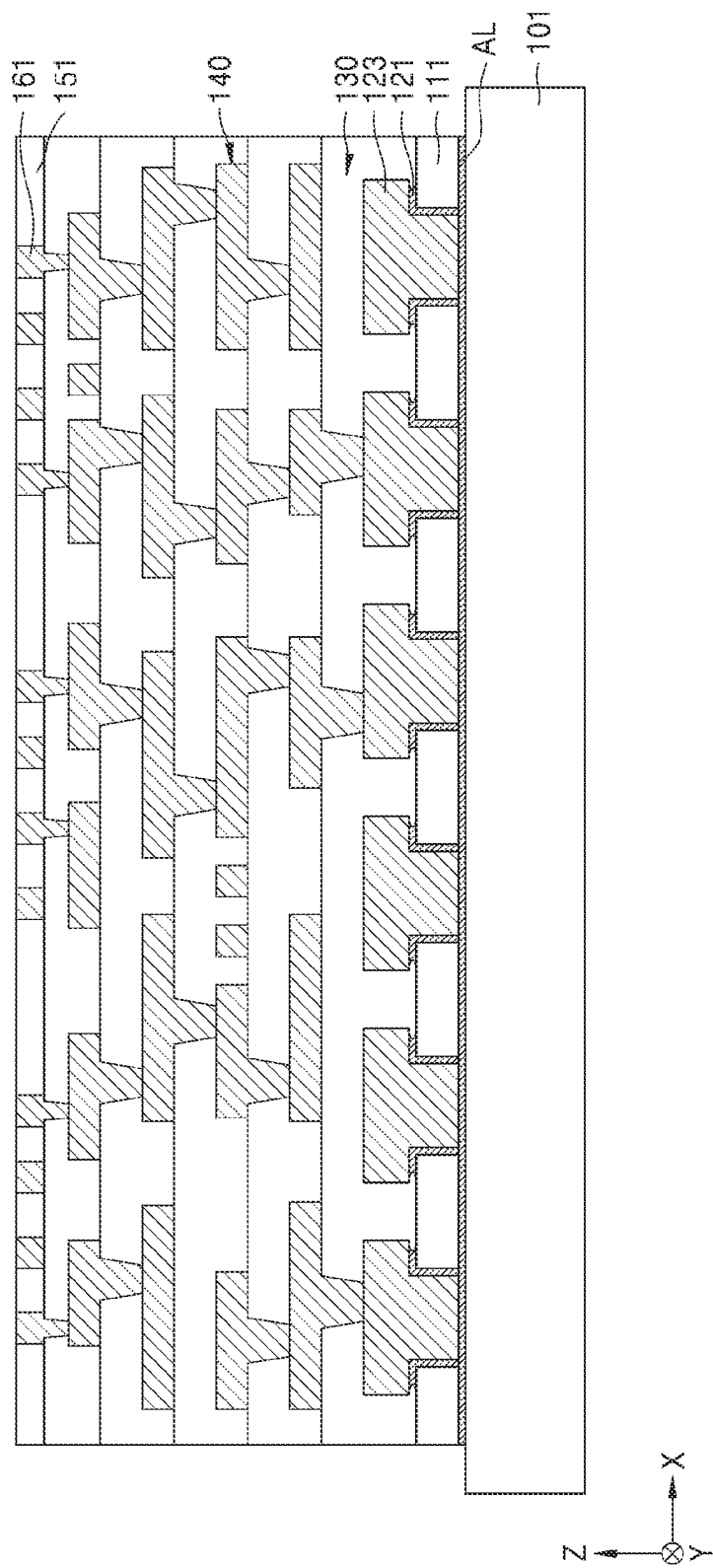

Referring to FIG. 22, a redistribution layer structure 140 and an upper pad 161 are sequentially formed on the bump pad 123.

The redistribution layer structure 140 and the upper pad 161 may for example be formed of copper (Cu), nickel (Ni), gold (Au), chromium (Cr), titanium (Ti), or palladium (Pd), or an alloy thereof. In some embodiments, the redistribution layer structure 140 may be formed through a damascene process. Because damascene processes are well known, detailed descriptions thereof are omitted.

As a similar process is performed repeatedly, all of a redistribution layer structure 140, an insulating layer 130 surrounding the redistribution layer structure 140, an upper pad 161 on the redistribution layer structure 140, and an upper protective layer 151 surrounding the upper pad 161 may be formed.

Figure 23:
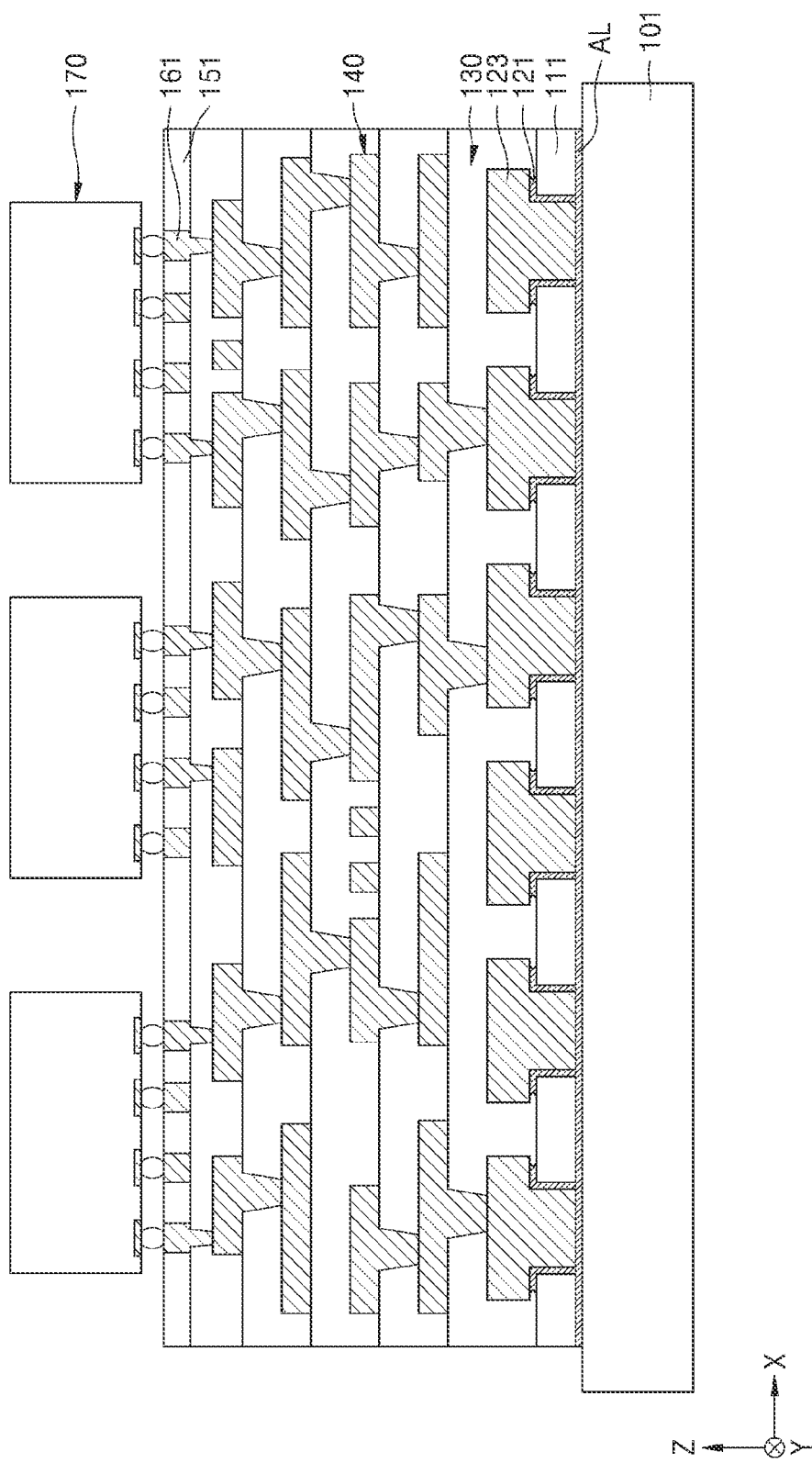

Referring to FIG. 23, a semiconductor chip 170 is mounted to be electrically connected to the upper pad 161.

The semiconductor chip 170 may be electrically connected to the upper pad 161 using solder bumps. The semiconductor chip 170 may be an individualized semiconductor die or a sub-package in which a semiconductor die is molded. The semiconductor chip 170 is mounted such that the active surface on which the connection pad is formed can face downward, and the connection pad of the semiconductor chip 170 can be aligned with the upper surface of the upper pad 161.

A plurality of the semiconductor chips 170 may be mounted. Some of the plurality of semiconductor chips 170 may be logic chips, and others may be memory chips. For convenience sake, the following description may refer to a semiconductor chip 170 instead of a plurality of semiconductor chips 170.

In the process of electrically connecting the semiconductor chip 170 and the solder bump, a gap may be formed between the semiconductor chip 170 and the solder bump. Such a gap may cause a problem in the reliability of the connection between the semiconductor chip 170 and the solder bump. To ensure reliability, an underfill (not shown) may be injected and cured to reinforce the connection.

The semiconductor chip 170 is more stably fixed on the solder bump by the underfill, and despite the difference in thermal expansion coefficients between the semiconductor chip 170 and the solder bump, electrical separation of the semiconductor chip 170 and the solder bump may be prevented. In some embodiments the molding member 181 (see FIG. 24) may be filled directly into the gap between the semiconductor chip 170 and the solder bump, and in this case, the underfill may not be necessary.

Figure 24:
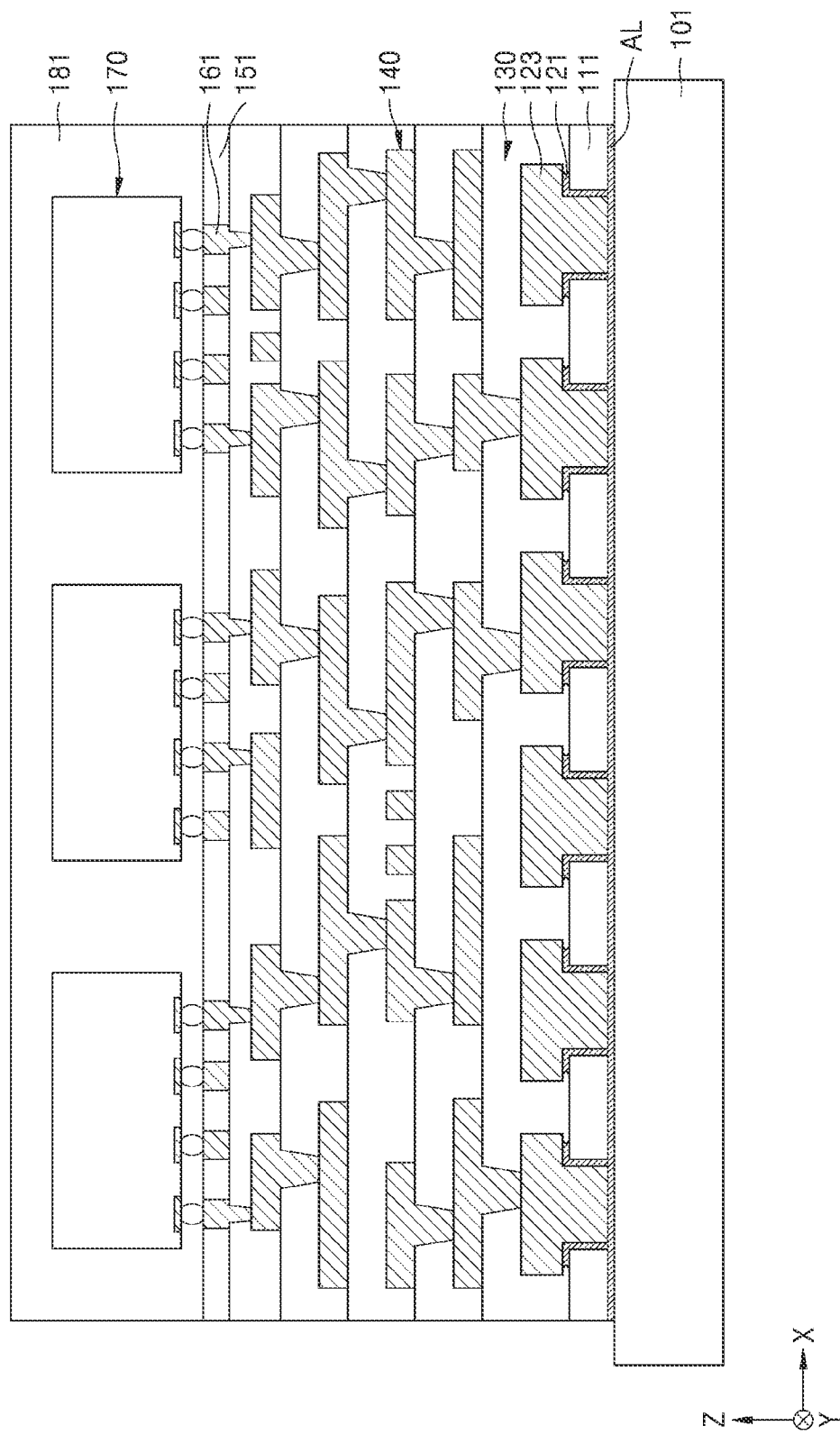

Referring to FIG. 24, a molding member 181 is formed to surround the side surface and the upper surface of the semiconductor chip 170.

The molding member 181 may protect the semiconductor chip 170 from external influences such as impact. In order to perform this role, the molding member 181 may be made of an epoxy mold compound, resin, or the like.

In some embodiments, the molding member 181 may cover only the side surface of the semiconductor chip 170 and may expose the upper surface of the semiconductor chip 170 to the outside.

Figure 25:
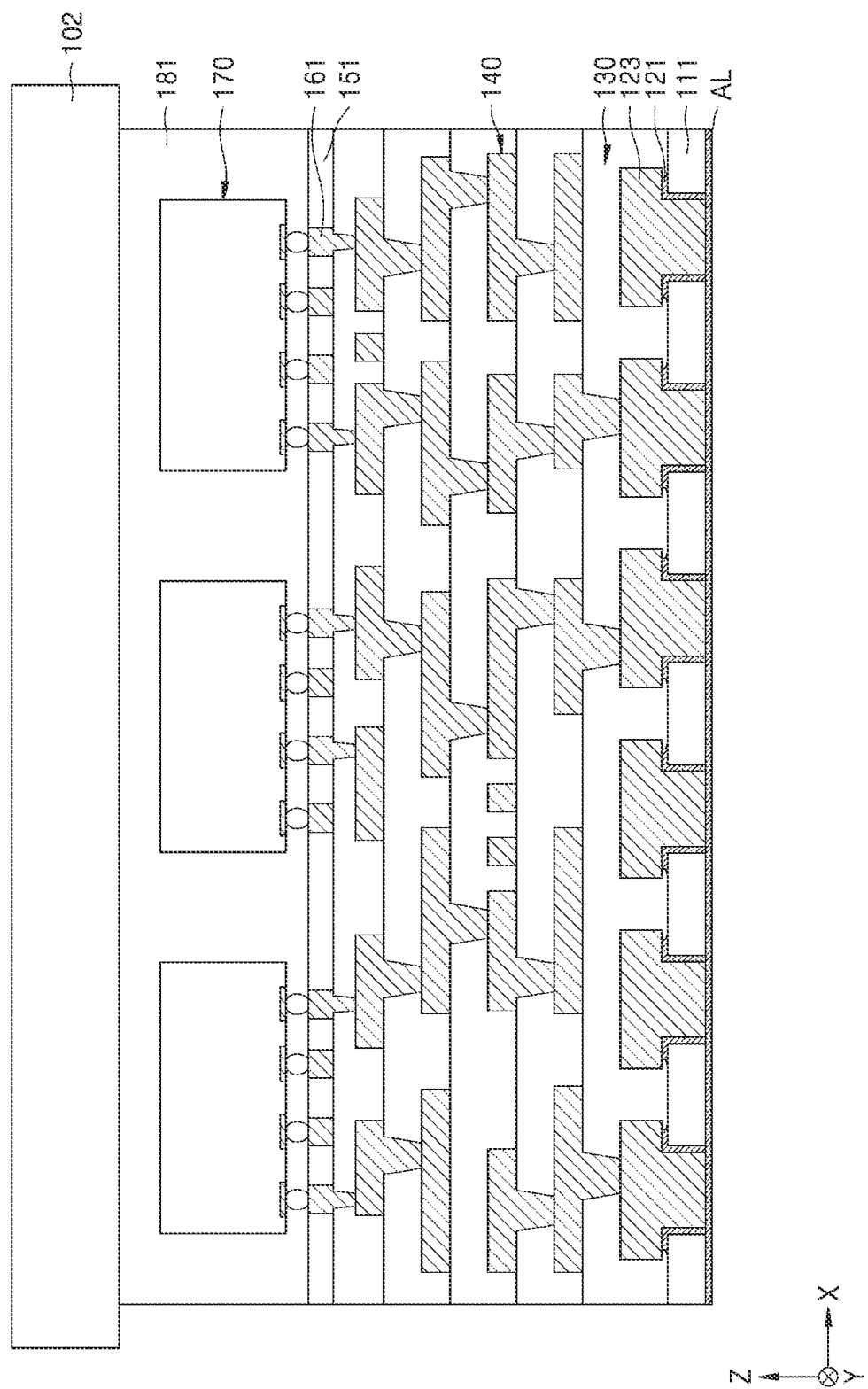

Referring to FIG. 25, a carrier substrate 102 is attached to the molding member 181 so as to face the support substrate 101 (see FIG. 24), and the support substrate 101 (see FIG. 24) is removed.

The carrier substrate 102 may include, for example, glass or aluminum oxide. In order to facilitate the attachment of the carrier substrate 102, a second adhesive layer (not shown) may be formed between the carrier substrate 102 and the molding member 181. The second adhesive layer may be in liquid form or gel form that can be easily deformed at a predetermined pressure.

In order to separate and remove the support substrate 101 (see FIG. 24), the support substrate 101 (see FIG. 24) may be irradiated with a laser. The bonding force between the adhesive layer AL and the support substrate 101 (see FIG. 24) may be weakened by irradiation of the laser, and the support substrate 101 (see FIG. 24) may be separated.

Figure 26:
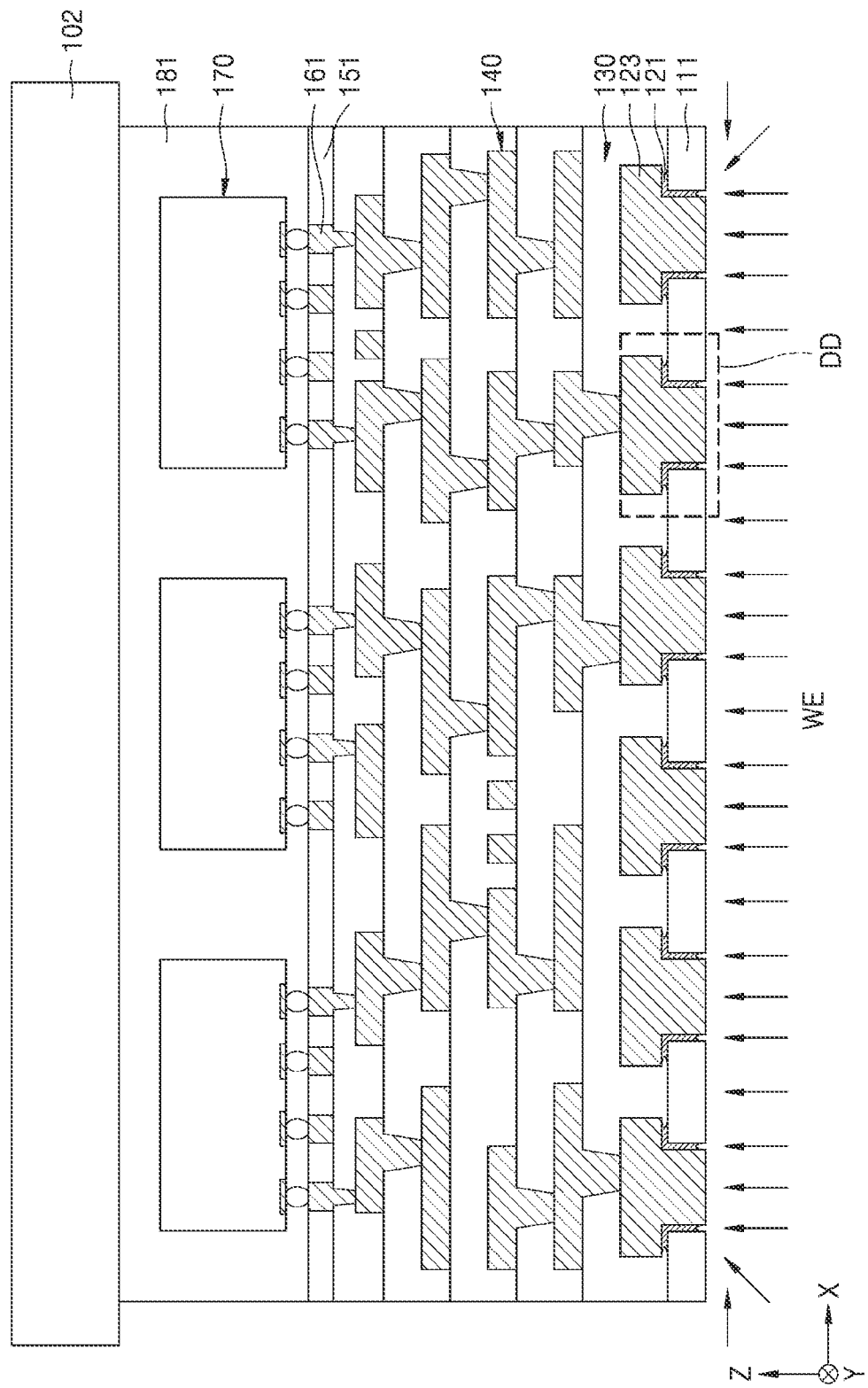
Figure 27:
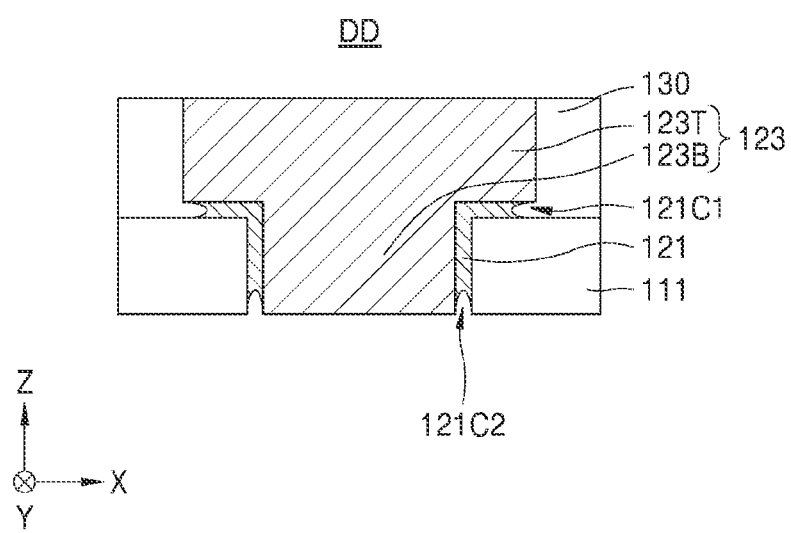

Referring to FIGS. 26 and 27 together, the externally exposed adhesive layer AL (see FIG. 25) is removed by wet etching WE.

Due to the wet etching WE, the lower surface of the bump pad 123 and the lowest surface of the lower protective layer 111 may be exposed. The level of the lower surface of the bump pad 123 may be substantially the same as the level of the lowest surface of the lower protective layer 111.

When the adhesive layer AL (see FIG. 25) is etched using wet isotropic etching WE, a second undercut 121C2 may be formed at the metal seed layer 121 disposed between the bump pad 123 and the lower protective layer 111. That is, a second undercut 121C2 may be formed at the other end of the metal seed layer 121 contacting the lower structure 123B. The second undercut 121C2 may be formed in (or along) a third direction (Z direction).

Figure 28:
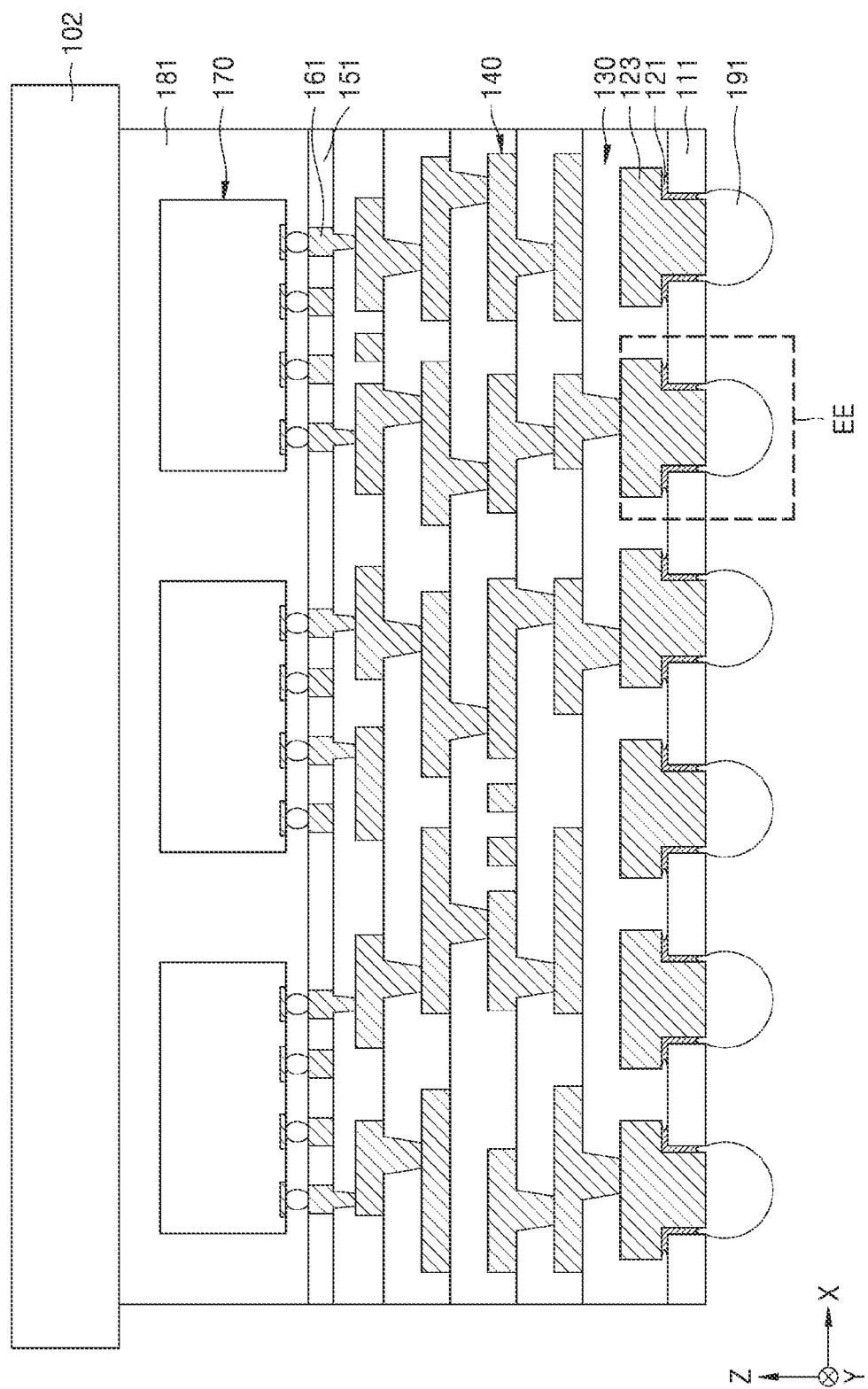
Figure 29:
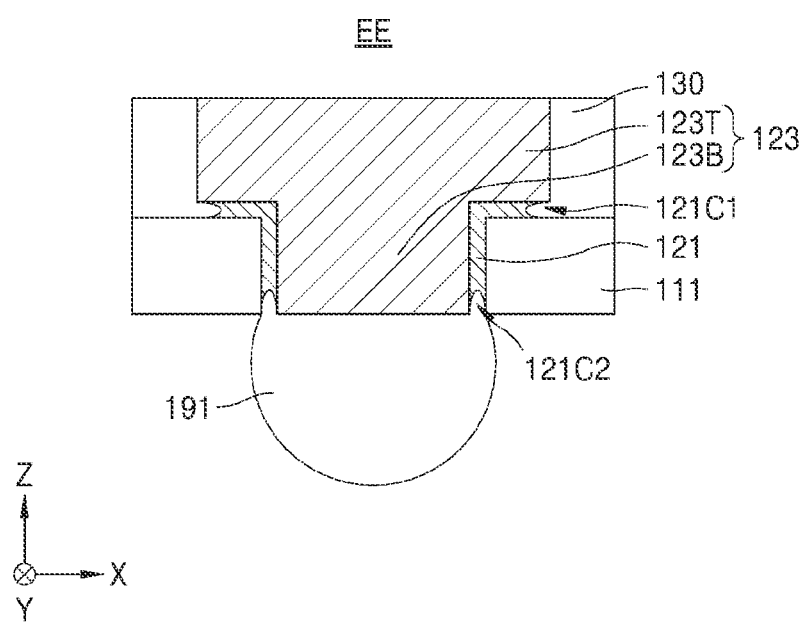

Referring to FIGS. 28 and 29 together, a bump structure 191, which is an external connection terminal, is formed on the lower surface of the bump pad 123.

In some embodiments, the bump structure 191 may be formed as solder balls. The solder ball is formed in a spherical shape, and may be attached to the lower surface of the bump pad 123. In other embodiments, in relation to the bump structure 191, a solder layer may be formed on the lower surface of the bump pad 123, and the solder layer may be melted by a reflow process to form a reflow solder layer.

In some embodiments the bump structure 191 may have a third width W3 that is greater than the second width W2 of the lower structure 123B (see FIGS. 3 and 4). According to such embodiments, the first undercut 121C1 may be filled by the insulating layer 130, and the second undercut 121C2 may be filled by the bump structure 191. The bump structure 191 may be disposed to contact the lower surface of the lower structure 123B, and may be disposed not to contact the lower surface of the lower protective layer 111. Further, the bump structure 191 may contact the side surface of the lower structure 123B and the side surface of the lower protective layer 111 through the second undercut 121C2.

Referring to FIG. 1 again, the carrier substrate 102 may be removed to complete manufacture of the semiconductor package 10. As a result, in relation to the semiconductor package 10 according to embodiments of the inventive concepts, occurrence of the peeling defect between the bump pad 123 and the lower protective layer 111 may be prevented by forming the bump pad 123 having a T shape and forming the metal seed layer 121 between the bump pad 123 and the lower protective layer 111.

Figure 30:
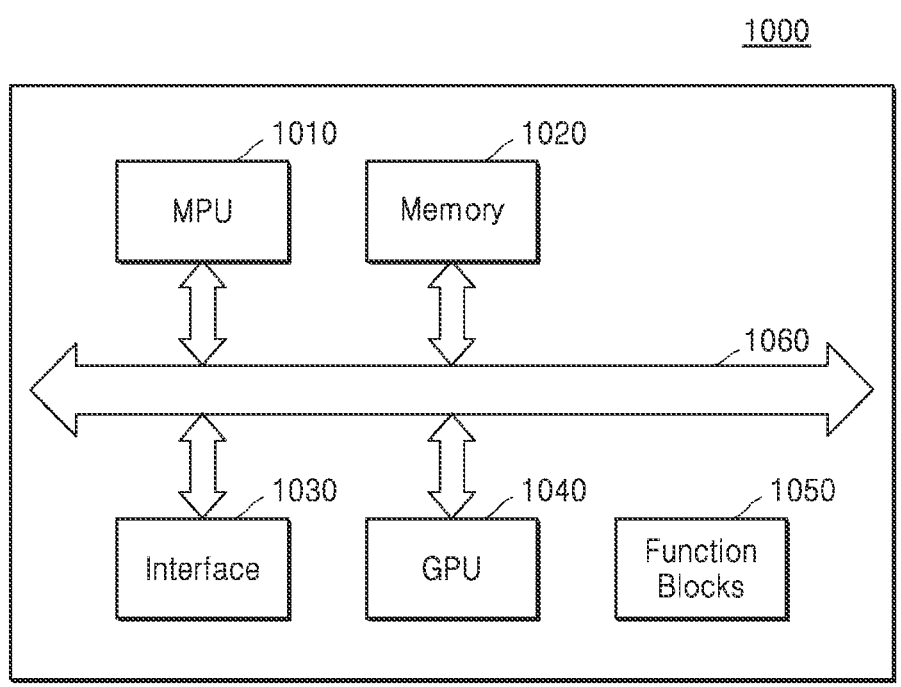
FIG. 30 illustrates a configuration diagram schematically showing a configuration of a semiconductor package according to embodiments of the inventive concepts.

FIG. 30 illustrates a configuration diagram schematically showing a configuration of a semiconductor package according to embodiments of the inventive concepts.

Referring to FIG. 30, the semiconductor package 1000 may include a micro processing unit (MPU) 1010, a memory 1020, an interface 1030, a graphic processing unit (GPU) 1040, and function blocks 1050, interconnected by a bus 1060. The semiconductor package 1000 may include both the MPU 1010 and the GPU 1040, or may include only one of the MPU 1010 and the GPU 1040.

The MPU 1010 may include a core and a cache. For example, the MPU 1010 may include a multi-core. Each core of a multi-core may have the same or different performance. In addition, each core of the multi-core may be activated at the same time, or may be activated at different times.

The memory 1020 may store results processed by the function blocks 1050 under the control of the MPU 1010. The interface 1030 may exchange information or signals with external devices. The GPU 1040 may perform graphic functions. For example, the GPU 1040 may perform as a video codec or may process 3D graphics. The function blocks 1050 may perform various functions. For example, when the semiconductor package 1000 is an application processor used in a mobile device, some of the function blocks 1050 may perform a communication function.

The semiconductor package 1000 may include any one of the semiconductor packages 10, 20, 30, 40, 50, 60, 70, and 80 described with reference to FIGS. 1 to 11 above.

While the inventive concepts have been particularly shown and described with reference to embodiments thereof, it should be understood that various changes in form and detail may be made therein without departing from the spirit and scope of the following claims.

What is claimed is:

1. A semiconductor package comprising:
a first sub-package including a first semiconductor chip;
a second sub-package disposed on the first sub-package and including a second semiconductor chip; and
an inter-package connection structure connecting the first sub-package to the second sub-package,
wherein each of the first sub-package and the second sub-package comprises
a lower redistribution layer structure,
a bump pad disposed under the lower redistribution layer structure, the bump pad having an upper structure of a first width and a lower structure of a second width less than the first width,
a metal seed layer disposed along a lower surface of the upper structure and a side surface of the lower structure,
a lower insulating layer surrounding the lower redistribution layer structure and the bump pad, and
a bump structure disposed under the bump pad,
wherein a first undercut is disposed at one end of the metal seed layer that contacts the upper structure and a second undercut is disposed at an other end of the metal seed layer that contacts the lower structure, and
wherein the first semiconductor chip and the second semiconductor chip include different types of semiconductor chips.

2. The semiconductor package of claim 1, wherein the first sub-package further comprises a frame structure disposed around a side surface of the first semiconductor chip, and
wherein the frame structure and the lower redistribution layer structure of the first sub-package are electrically connected to each other by a through electrode disposed inside the frame structure.

3. The semiconductor package of claim 2, wherein the through electrode comprises a plurality of wiring layers as a multi-stage structure.

4. The semiconductor package of claim 1, wherein the first undercut and the second undercut extend orthogonal to each other,
wherein a length of the first undercut from a side surface of the upper structure is about 2 μm or less, and
wherein a length of the second undercut from a lower surface of the lower structure is about 3 μm or less.

5. A semiconductor package comprising:
a bump structure;
a T-shaped bump pad disposed on the bump structure, the T-shaped bump pad having an upper structure and a lower structure with a step difference between the upper structure and the lower structure;
a redistribution layer structure disposed on the T-shaped bump pad and having a plurality of redistribution layer lines;
a plurality of insulating layers surrounding the redistribution layer structure and the T-shaped bump pad;
a metal seed layer conformally disposed between a lower surface of the upper structure and a lowermost insulating layer of the plurality of insulating layers, and between a side surface of the lower structure and the lowermost insulating layer; and
at least one semiconductor chip disposed on the redistribution layer structure and electrically connected to the bump structure,
wherein a first undercut is disposed at one end of the metal seed layer, a second undercut is disposed at an other end of the metal seed layer.

6. The semiconductor package of claim 5, wherein the first undercut and the second undercut extend orthogonal to each other,
wherein a length of the first undercut is about 2 μm or less, and a length of the second undercut is about 3 μm or less.

7. The semiconductor package of claim 5, wherein a thickness of the T-shaped bump pad is about 3 μm to about 15 μm, and wherein the bump pad comprises copper (Cu).

8. The semiconductor package of claim 5, further comprising an interposer,
wherein the at least one semiconductor chip is disposed on an upper portion of the interposer, and
the redistribution layer structure is disposed on a lower portion of the interposer.

9. The semiconductor package of claim 8, wherein the semiconductor chip and the redistribution layer structure are electrically connected to each other via a through electrode penetrating the interposer.

10. The semiconductor package of claim 9, further comprising a molding member surrounding the semiconductor chip on the interposer.

11. The semiconductor package of claim 10, further comprising a heat dissipation member on an upper portion of the molding member.

12. A semiconductor package comprising:
- a redistribution layer structure having a first main surface and second main surface opposite the first main surface, the redistribution layer structure including a redistribution layer line and an insulating layer;
- a semiconductor chip on the first main surface of the redistribution layer structure and connected to the redistribution layer line;
- a bump pad at the second main surface of the redistribution layer structure,
- the bump pad comprising a first structure buried in the redistribution layer structure and connected to the redistribution layer line, and a second structure protruding from the first structure, the second structure having a pad surface exposed from the insulating layer at the second main surface of the redistribution layer structure; and
- a metal seed layer disposed between the insulating layer and a bottom surface of the first structure, and between the insulating layer and a side surface of the second structure, the metal seed layer having first and second undercuts at opposite ends thereof.

13. The semiconductor package of claim 12, further comprising a bump structure at the pad surface of the second structure.

14. The semiconductor package of claim 13, wherein the first undercut is filled with the insulating layer, and the second undercut is filled with the bump structure.

15. The semiconductor package of claim 14, wherein a width of the bump structure is greater than a width of the second structure.

16. The semiconductor package of claim 13, wherein the first undercut is filled with the insulating layer, and the second undercut is empty.

17. The semiconductor package of claim 16, wherein a width of the second structure is greater than or equal to a width of the bump structure.

18. The semiconductor package of claim 12, wherein the second main surface and the pad surface are coplanar.

19. The semiconductor package of claim 12, further comprising:
- a frame structure on the first main surface of the redistribution layer structure and disposed around a side surface of the semiconductor chip; and
- a through electrode disposed inside the frame structure and connected to the redistribution layer line.

20. The semiconductor package of claim 19, further comprising a molding member on the first main surface of the redistribution layer structure, and covering the semiconductor chip and the frame structure.

* * * * *